United States Patent
Na et al.

(10) Patent No.: US 10,014,401 B2
(45) Date of Patent: Jul. 3, 2018

(54) SEMICONDUCTOR DEVICE WITH PASSIVATION LAYER FOR CONTROL OF LEAKAGE CURRENT

(71) Applicant: Electronics and Telecommunications Research Institute, Daejeon (KR)

(72) Inventors: Jeho Na, Daejeon (KR); Hyung Seok Lee, Daejeon (KR); Chi Hoon Jun, Daejeon (KR); Sang Choon Ko, Daejeon (KR); Myungjoon Kwack, Gimpo-si (KR); Young Rak Park, Daejeon (KR); Woojin Chang, Daejeon (KR); Hyun-Gyu Jang, Cheongju-si (KR); Dong Yun Jung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/414,156

(22) Filed: Jan. 24, 2017

(65) Prior Publication Data

US 2017/0213904 A1 Jul. 27, 2017

(30) Foreign Application Priority Data

Jan. 25, 2016 (KR) .................. 10-2016-0008938
Aug. 9, 2016 (KR) .................. 10-2016-0101508

(51) Int. Cl.
| | |
|---|---|
| *H01L 29/778* | (2006.01) |
| *H01L 29/20* | (2006.01) |
| *H01L 29/205* | (2006.01) |
| *H01L 23/31* | (2006.01) |
| *H01L 29/06* | (2006.01) |

(Continued)

(52) U.S. Cl.
CPC ...... *H01L 29/7787* (2013.01); *H01L 23/3171* (2013.01); *H01L 29/0649* (2013.01); *H01L 29/0657* (2013.01); *H01L 29/2003* (2013.01); *H01L 29/205* (2013.01); *H01L 29/41758* (2013.01); *H01L 29/42364* (2013.01); *H01L 29/42372* (2013.01); *H01L 29/66462* (2013.01)

(58) Field of Classification Search
None
See application file for complete search history.

(56) References Cited

U.S. PATENT DOCUMENTS

| | | |
|---|---|---|
| 5,885,847 A | 3/1999 | Yoon et al. |
| 7,332,795 B2 | 2/2008 | Smith et al. |

(Continued)

FOREIGN PATENT DOCUMENTS

EP 2747143 A1 6/2014

OTHER PUBLICATIONS

David J. Meyer, "Surface Passivation Studies of AlGaN/GaN High Electron Mobility Transistors", Doctoral Dissertation, The Pennsylvania State University, Dec. 2008.

*Primary Examiner* — Bilkis Jahan
(74) *Attorney, Agent, or Firm* — Rabin & Berdo, P.C.

(57) ABSTRACT

A semiconductor device includes a semiconductor structure including a substrate, a first semiconductor layer on the substrate, and a second semiconductor layer on the first semiconductor layer, a first passivation pattern provided on the semiconductor structure, and first and second conductive patterns provided on the semiconductor structure and spaced from the first passivation pattern.

16 Claims, 18 Drawing Sheets

(51) Int. Cl.
*H01L 29/417* (2006.01)
*H01L 29/423* (2006.01)
*H01L 29/66* (2006.01)

(56) References Cited

U.S. PATENT DOCUMENTS

| | | | |
|---|---|---|---|
| 8,062,931 B2 | 11/2011 | Lorenz et al. | |
| 8,890,263 B2* | 11/2014 | Yamamura | H01L 29/2003 257/194 |
| 2009/0230429 A1* | 9/2009 | Miyamoto | H01L 29/402 257/192 |
| 2013/0228788 A1* | 9/2013 | Yamamura | H01L 29/2003 257/76 |
| 2013/0228790 A1* | 9/2013 | Yamamura | H01L 29/2003 257/76 |
| 2013/0292835 A1* | 11/2013 | King | H01L 21/02178 257/741 |
| 2015/0137135 A1* | 5/2015 | Green | H01L 29/872 257/76 |
| 2015/0236169 A1 | 8/2015 | Park et al. | |

* cited by examiner

SEMICONDUCTOR DEVICE WITH PASSIVATION LAYER FOR CONTROL OF LEAKAGE CURRENT

CROSS-REFERENCE TO RELATED APPLICATIONS

This U.S. non-provisional patent application claims priority under 35 U.S.C. § 119 of Korean Patent Application Nos. 10-2016-0008938, filed on Jan. 25, 2016, and 10-2016-0101508, filed on Aug. 9, 2016, the entire contents of which are hereby incorporated by reference.

BACKGROUND

The present disclosure herein relates to a semiconductor device and a method of fabricating the same, and more particularly, to a semiconductor device having improved electrical characteristics and a method of fabricating the same.

Semiconductor devices are largely classified into two types, for example, vertical devices where current flows vertical to a substrate and lateral devices where current flows parallel to a substrate. Type materials used in manufacturing lateral semiconductor devices are III-V compounds such as GaAs, GaN, AlN, InP, InGaAs, and AlGaN. Especially, since AlGaN/GaN based power semiconductor devices have two-dimensional electron gas formed naturally between AlGaN/GaN, a high electric field strength, and a high electron mobility, they receive attention as the next-generation power devices.

SUMMARY

The present disclosure provides a semiconductor device with improved reverse characteristics.

An embodiment of the inventive concept provides a semiconductor device including: a semiconductor structure including a substrate, a first semiconductor layer on the substrate, and a second semiconductor layer on the first semiconductor layer; a first passivation pattern provided on the semiconductor structure; and first and second conductive patterns provided on the semiconductor structure and spaced from the first passivation pattern.

In an embodiment, the semiconductor device may further include a second passivation pattern provided on the first passivation pattern, wherein the second passivation pattern may be spaced from the first passivation pattern between the first and second conductive patterns and a first air gap may be defined between the first passivation pattern between the first and second conductive patterns and the second passivation pattern.

In an embodiment, the first and second passivation patterns may be exposed by the first air gap and the first and second passivation patterns exposed by the first air gap may be spaced from each other.

In an embodiment, the second passivation pattern may cover a side of the first conductive pattern and a side of the second conductive pattern, which face each other.

In an embodiment, the second passivation pattern may cover an upper surface of the semiconductor structure immediately adjacent to each of a side of the first conductive pattern and a side of the second conductive pattern, which face each other.

In an embodiment, at least a part of an upper surface of the semiconductor structure between the first and second conductive patterns may be exposed by the first air gap.

In an embodiment, the semiconductor device may further include a gap fill pattern penetrating the second passivation pattern to contact the semiconductor structure.

In an embodiment, a lower part of the gap fill pattern may be exposed by the first air gap.

In an embodiment, a lower part of the gap fill pattern may contact an end part of the first passivation pattern between the first and second conductive patterns.

In an embodiment, the gap fill pattern may be spaced from an area between the first and second conductive patterns along an extension direction of the first and second conductive patterns.

In an embodiment, the semiconductor device may further include a third conductive pattern spaced from the first conductive pattern with the second conductive pattern therebetween, wherein the third conductive pattern may be spaced from the first passivation pattern; the second passivation pattern may be spaced from the first passivation pattern between the second and third conductive patterns and a second air gap may be defined between the first passivation pattern between the second and third conductive patterns and the second passivation pattern; and the first and third conductive patterns may be electrically connected to each other.

In an embodiment, the semiconductor device may further include: a gate insulating pattern interposed between the second conductive pattern and the semiconductor structure; and a third conductive pattern disposed on the opposite side of the first conductive pattern on the basis of the second conductive pattern, wherein the third conductive pattern may be spaced from the first passivation pattern; and the second passivation pattern may be spaced from the first passivation pattern between the second and third conductive patterns and a second air gap may be defined between the first passivation pattern between the second and third conductive patterns and the second passivation pattern.

In an embodiment, the first conductive pattern may include a metal that ohmic-contacts the semiconductor structure; and the second conductive pattern may include a metal that is schottky-junctioned to the semiconductor structure.

In an embodiment, the first semiconductor layer may include a 2-dimensional (2-DEG) electron gas layer in an area adjacent to a boundary of the first and second semiconductor layers.

In an embodiment, the first semiconductor layer may include a GaN layer and the second semiconductor layer may include an AlGaN layer.

In an embodiment, the semiconductor structure may further include a capping layer on the second semiconductor layer.

In an embodiment of the inventive concept, a method of fabricating a semiconductor device includes: providing a semiconductor structure including a substrate, a first semiconductor layer on the substrate, and a second semiconductor layer on the first semiconductor layer; forming a first passivation pattern on the semiconductor structure; forming a first conductive pattern and a second conductive pattern provided on the semiconductor structure and spaced from the first passivation pattern; forming a sacrificial pattern covering the first passivation pattern between the first and second conductive patterns; forming a second passivation pattern covering the first passivation pattern, the sacrificial pattern, the first conductive pattern, and the second conductive pattern; and forming an air gap at a lower part of the second passivation pattern by removing the sacrificial pattern.

In an embodiment, the removing of the sacrificial pattern may include: forming a hole that exposes the sacrificial pattern by etching a part of the second passivation pattern; and removing the sacrificial pattern by providing an etching liquid for etching the sacrificial pattern through the hole.

In an embodiment, the forming of the hole may include forming one pair of holes for exposing both end parts of the sacrificial pattern.

In an embodiment, the method may further include forming a gap fill pattern for filling the hole after the removing of the sacrificial pattern, wherein a material of the gap fill pattern may be different from materials of the first and second passivation patterns.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
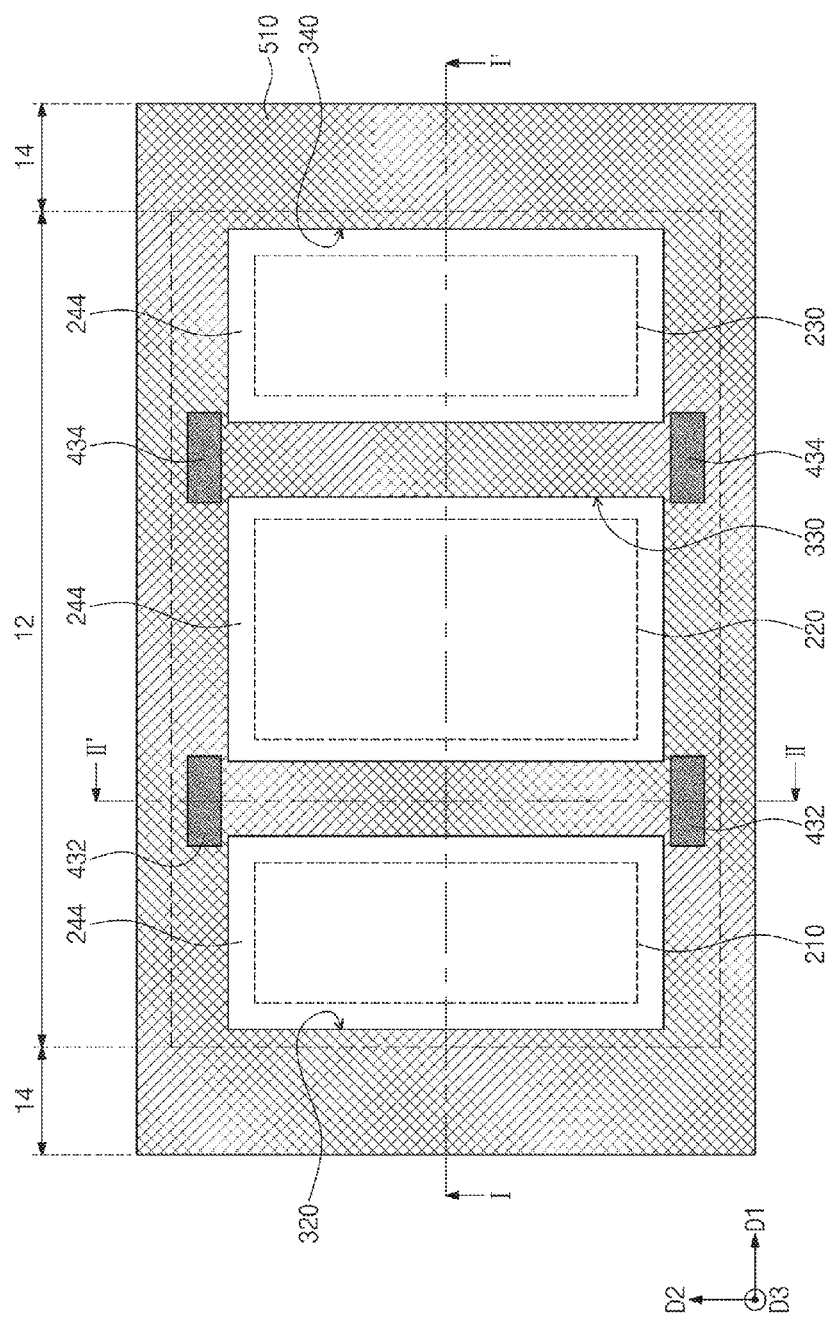
FIG. 1 is a plan view illustrating a semiconductor device according to an embodiment of the technical spirit of the inventive concept.

In order to fully understand the configuration and effects of the technical spirit of the inventive concept, preferred embodiments of the technical spirit of the inventive concept will be described with reference to the accompanying drawings. However, the technical spirit of the inventive concept is not limited to the embodiments set forth herein and may be implemented in various forms and various modifications may be applied thereto. Only, the technical spirit of the inventive concept is disclosed to the full through the description of the embodiments, and it is provided to those skilled in the art that the inventive concept belongs to inform the scope of the inventive concept completely.

Like reference numerals refer to like elements throughout the specification. Embodiments described in this specification will be described with plan views and/or sectional views, that is, ideal exemplary views of the inventive concept. In the drawings, the thicknesses of areas are exaggerated for effective description. Areas exemplified in the drawings have general properties, and are used to illustrate a specific shape of a semiconductor package region. Thus, this should not be construed as limited to the scope of the inventive concept. It will be understood that various terms are used herein to describe various components but these components should not be limited by these terms. These terms are just used to distinguish a component from another component. Embodiments described herein include complementary embodiments thereof.

The terms used in this specification are used only for explaining specific embodiments while not limiting the present invention. The terms of a singular form may include plural forms unless referred to the contrary. The meaning of "comprises," and/or "comprising" in this specification specifies the mentioned component but does not exclude at least one another component.

Hereinafter, preferred embodiments of the technical spirit of the inventive concept are described with reference to the accompanying drawings so that the inventive concept is described in more detail.

Figure 2:
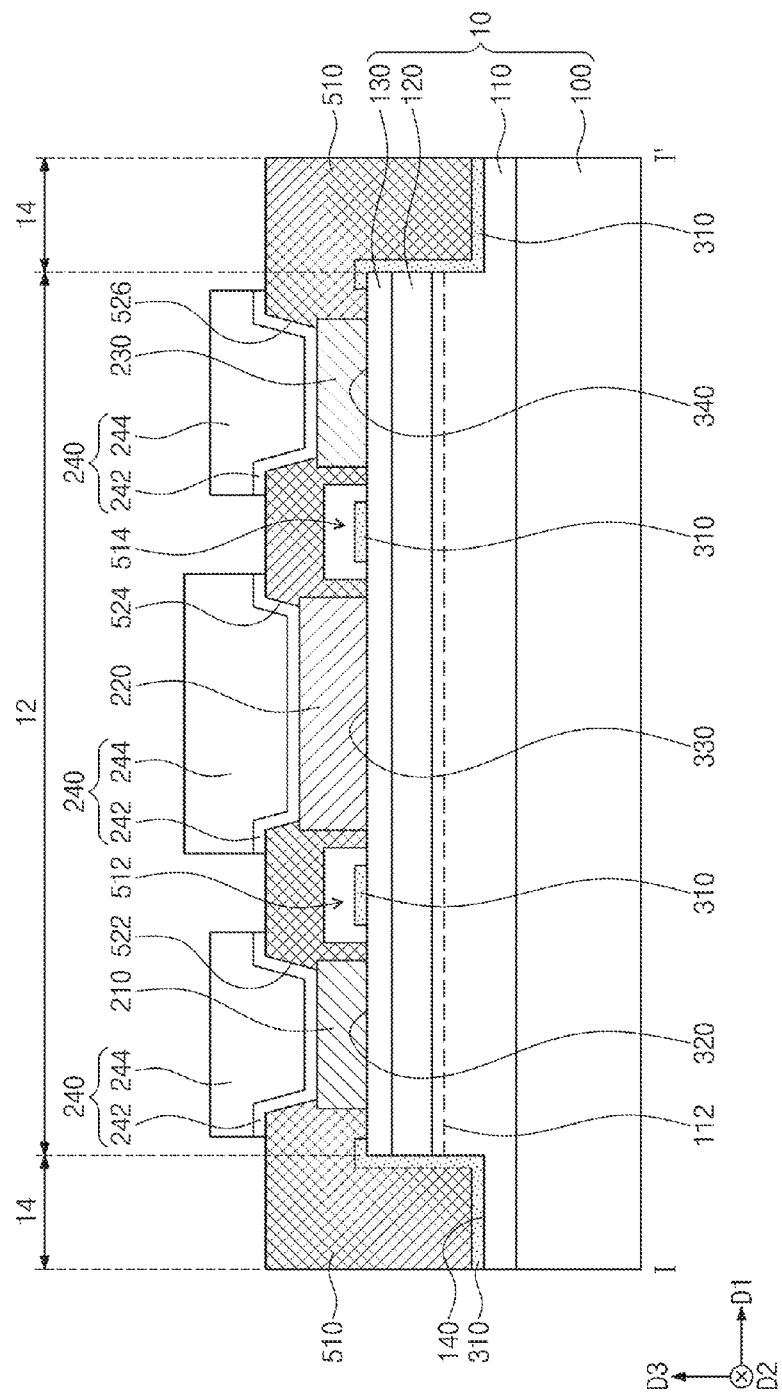
FIGS. 2 and 3 are sectional views taken along a line I-I' and a line II-II' of FIG. 1.
Figure 3:
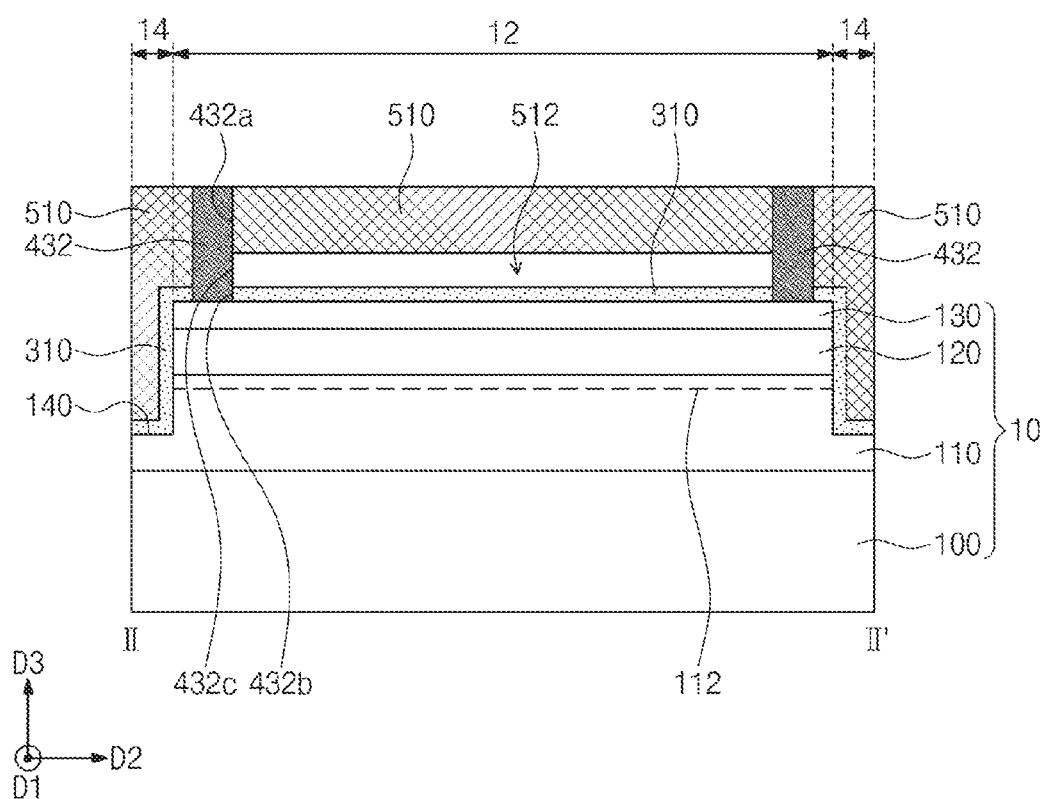

FIG. 1 is a plan view illustrating a semiconductor device according to an embodiment of the inventive concept. FIGS. 2 and 3 are sectional views taken along a line I-I' and a line II-II' of FIG. 1.

Referring to FIGS. 1 to 3, a substrate 100 may be provided. The substrate 100 may be a high-resistance substrate having an insulating property. For example, the substrate 100 may include Al2O3, Si, GaAs, SiC, diamond, or GaN.

A first semiconductor layer 110 and a second semiconductor layer 120 may be provided on the substrate 100. In exemplary embodiments, the first semiconductor layer 110 may include III-V compound semiconductors (for example, GaAs, GaN, AlN, InP, InGaAs, and AlGaN). For example, the first semiconductor layer 110 may include a GaN layer. The first semiconductor layer 110 may be an epitaxial layer.

The second semiconductor layer 120 may be provided on the first semiconductor layer 110. In exemplary embodiments, the second semiconductor layer 120 may include III-V compound semiconductors (for example, GaAs, GaN, AlN, InP, InGaAs, and AlGaN). The second semiconductor layer 120 may include a different material than the first semiconductor layer 110. For example, the second semiconductor layer 120 may include an AlGaN layer. The second semiconductor layer 120 may be bonded to the first semiconductor layer 110 through heterojunction. Accordingly, a 2-dimensional electron gas (2-DEG) layer 112, that is, a free electron layer, may be provided in the first semiconductor layer 110. The 2-DEG layer 112 may be provided adjacent to the boundary of the first semiconductor layer 110 and the second semiconductor layer 120. The 2-DEG layer 112 may be formed on the first semiconductor layer 110. The second semiconductor layer 120 may be an epitaxial layer.

A capping layer 130 may be provided on the second semiconductor layer 120. In one example, the capping layer 130 may include a III-V compound semiconductor. For example, the capping layer 130 may include a GaN layer. The capping layer 130 may protect an upper surface of the semiconductor layer 120 and reduce leakage current. In other embodiments, the capping layer 130 may be omitted. A semiconductor structure 10 may be defined with a structure including the substrate 100, the first and second semiconductor layers 110 and 120, and the capping layer 130.

A mesa-structure etching area 140 may be provided to an end part of the semiconductor structure 10. The mesa-structure etching area 140 may define an active region 12 of a semiconductor device. In the plan view, the mesa-structure etching area 140 may surround the active region 12. As shown in the drawing, the mesa-structure etching area 140 may be a device isolation area 14. Unlike FIGS. 1 to 3, the device isolation area 14 may include a device isolation pattern formed through ion implantation in the semiconductor structure 10.

A first passivation pattern 310 may be provided on the semiconductor structure 10. The first passivation pattern 310 may cover an upper part of the semiconductor structure 10. The first passivation pattern 310 may conformally cover an upper surface of the semiconductor structure 10 in the active region 12. The first passivation pattern 310 may extend into the inside of the mesa-structure etching area 140 of the semiconductor structure 10 to conformally cover the inner surface of the mesa-structure etching area 140. The first passivation pattern 310 may include a first electrode hole 320, a second electrode hole 330, and a third electrode hole 340, which expose an upper surface of the semiconductor structure 10. The first to third electrode holes 320, 330, and 340 may be arranged along a first direction D1. The first passivation pattern 310 may include a material having high breakdown electric field characteristics and low capacitance characteristics. For example, the first passivation pattern 310 may include SixNy, Al2O3, SiO2, or a combination thereof. The first passivation pattern 310 may prevent the phenomenon that electrons are trapped in the semiconductor structure 10 and minimize leakage current during an operation of a semiconductor device.

A first conductive pattern 210, a second conductive pattern 220, and a third conductive pattern 230 may be respectively provided on upper surfaces of the semiconductor structure 10 exposed by the first to third electrode holes 320, 330, and 340. Each of the first to third conductive patterns 210, 220, and 230 may be spaced from the first passivation pattern 310. For example, each of the first to third conductive patterns 210, 220, and 230 may be spaced from the first passivation pattern 310 in the first direction D1 and a second direction D2. Sidewalls of each of the first to third conductive patterns 210, 220, and 230 may not contact sidewalls of the first passivation pattern 310 exposed by each of the first to third electrode holes 320, 330, and 340. For example, sidewalls of each of the first to third conductive patterns 210, 220, and 230 facing each other and sidewalls of the first passivation pattern 310 exposed by each of the first to third electrode holes 320, 330, and 340 may be spaced from each other. Each of the first to third conductive patterns 210, 220, and 230 may cover a portion of the capping layer 130 exposed by each of the first to third electrode holes 320, 330, and 340. Each of the first to third conductive patterns 210, 220, and 230 and the first passivation pattern 310 may expose the capping layer 130 therebetween. Each of the first to third conductive patterns 210, 220, and 230 may have a width according to the first direction D1. In exemplary embodiments, widths according to the first direction D1 of the first to third conductive patterns 210, 220, and 230 may be identical to each other. In exemplary embodiments, as shown in FIG. 2, the width according to the first direction D1 of the second conductive pattern 220 may be broader than the widths according to the first direction D1 of the first and third conductive patterns 210 and 230. Each of the first to third conductive patterns 210, 220, and 230 may have a length that extends according to the second direction D2. In exemplary embodiments, lengths according to the second direction D2 of the first to third conductive patterns 210, 220, and 230 may be identical to each other. The first and third conductive patterns 210 and 230 may include a metal that ohmic-contacts a semiconductor material. For example, the first and third conductive patterns 210 and 230 may be ohmic patterns that contact the capping layer 130. For example, the first and third conductive patterns 210 and 230 may include Ti, Al, Ni, Au, an alloy thereof, or a combination thereof. The second conductive pattern 220 may include a metal that is schottky-junctioned to a semiconductor material. For example, the second conductive pattern 220 may contact the capping layer 130 to form a schottky barrier. For example, the second conductive pattern 220 may include Ni, Au, an alloy thereof, or a combination thereof. The first and third conductive patterns 210 and 230 may be electrically connected to each other. For example, the first and third conductive patterns 210 and 230 may be electrically connected to each other through a wire described later. A second passivation pattern 510 may be provided on the first passivation pattern 310. The second passivation pattern 510 may include a first air gap 512 and a second air gap 514 therebelow. The first air gap 512 may be interposed between the first passivation pattern 310 510 between the first and second conductive patterns 210 and 220 and the second passivation pattern. The first air gap 512 may be surrounded by the first passivation pattern 310, the second passivation pattern 510, and the capping layer 130. The second passivation pattern 510 may be spaced from the first passivation pattern 310 between the first and second conductive patterns 210 and 220 with the first air gap 512 therebetween. The second passivation pattern 510 and the first passivation pattern 310 may be spaced from each other horizontally and vertically. For example, a lower surface of the second passivation pattern 510 exposed by the first air gap 512 and an upper surface of the first passivation pattern 310 exposed by the first air gap 512 may be spaced from each other along a third direction D3. For example, sides of the second passivation pattern 510 exposed by the first air gap 512 may be spaced from sides of the first passivation pattern 310 exposed by the first air gap 512 along the first direction D1.

The second air gap 514 may be interposed between the first passivation pattern 310 510 between the second and third conductive patterns 220 and 230 and the second passivation pattern. The second air gap 514 may be surrounded by the first passivation pattern 310, the second passivation pattern 510, and the capping layer 130. The second passivation pattern 510 may be spaced from the first passivation pattern 310 between the second and third conductive patterns 220 and 230 with the second air gap 514 therebetween. The second passivation pattern 510 and the first passivation pattern 310 may be spaced from each other horizontally and vertically. For example, a lower surface of the second passivation pattern 510 exposed by the second air gap 514 and an upper surface of the first passivation pattern 310 exposed by the second air gap 514 may be spaced from each other along the third direction D3. For example, sides of the second passivation pattern 510 exposed by the second air gap 514 may be spaced from sides of the first passivation pattern 310 exposed by the second air gap 514 along the first direction D1.

A first gap fill pattern 432 and a second gap fill pattern 434 may be provided in the second passivation pattern 510. The first and second gap fill patterns 432 and 434 may include an insulating material or a dielectric material. Materials of the first and second gap fill patterns 432 and 434 may be different from those of the first and second passivation patterns 310 and 510. For example, the first and second gap fill patterns 432 and 434 may include Benzocyclobutene (BCB) or polyimide.

The first gap fill pattern 432 may be disposed adjacent to the first and second conductive patterns 210 and 220. The first gap fill pattern 432 may be provided between the first and second conductive patterns 210 and 220. The first gap fill pattern 432 may be spaced from the first and second conductive patterns 210 and 220 along a direction toward the mesa structure etching area 140. In exemplary embodiments, the first gap fill pattern 432 may be spaced from an area between the first and second conductive patterns 210 and 220 along the second direction D2. The first gap fill pattern 432 may not overlap the first and second conductive patterns 210 and 220 along the first direction D1.

The first gap fill pattern 432 may penetrate the second passivation pattern 510 to contact the capping layer 130. In exemplary embodiments, an upper part of one side of the first gap fill pattern 432 may contact the second passivation pattern 510; a middle part of one side of the first gap fill pattern 432 may be exposed by the first air gap 512; and a lower part of one side of the first gap fill pattern 432 may contact the first passivation pattern 310. For example, as shown in FIG. 3, the first gap fill pattern 432 may include a first side 432a covered by the second passivation pattern 510, a second side 432b covered by the first passivation pattern 310, and a third side 432c exposed by the first air gap 512. The third side 432c of the first gap fill pattern 432 may be positioned between the first and second sides 432a and 432b. In exemplary embodiments, an upper part of another side of the first gap fill pattern 432 may contact the second passivation pattern 510, and a lower part of another side may contact the first passivation pattern 310. An upper surface of the first passivation pattern 310 and a lower surface of the second passivation pattern 510, which contact another side of the first gap fill pattern 432, may contact each other. In exemplary embodiments, one pair of first gap fill patterns 432 may be provided. Facing sides of one pair of first gap fill patterns 432 may be exposed by the first air gap 512.

The second gap fill pattern 434 may be disposed adjacent to the second and third conductive patterns 220 and 230. The second gap fill pattern 434 may be provided between the second and third conductive patterns 220 and 230. The second gap fill pattern 434 may be spaced from the second and third conductive patterns 220 and 230 along a direction toward the mesa structure etching area 140. In exemplary embodiments, the second gap fill pattern 434 may be spaced from an area between the second and third conductive patterns 220 and 230 along the second direction D2. The second gap fill pattern 434 may not overlap the second and third conductive patterns 220 and 230 along the first direction D1.

The second gap fill pattern 434 may penetrate the second passivation pattern 510 to contact the capping layer 130. In exemplary embodiments, an upper part of one side of the second gap fill pattern 434 may contact the second passivation pattern 510; a middle part of one side of the second gap fill pattern 434 may be exposed by the second air gap 514; and a lower part of one side of the second gap fill pattern 434 may contact the first passivation pattern 310. For example, in a cross-sectional viewpoint according to the second and third directions D2 and D3, the second gap fill pattern 434 may include a first side (not shown) covered by the second passivation pattern 510, a second side (not shown) covered by the first passivation pattern 310, and a third side (not shown) exposed by the second air gap 514. The third side of the second gap fill pattern 434 may be positioned between the first and second sides. In exemplary embodiments, an upper part of another side of the second gap fill pattern 434 may contact the second passivation pattern 510, and a lower part of another side may contact the first passivation pattern 310. An upper surface of the first passivation pattern 310 and a lower surface of the second passivation pattern 510, which contact another side of the second gap fill pattern 434, may contact each other. In exemplary embodiments, one pair of second gap fill patterns 434 may be provided. Facing sides of one pair of second gap fill patterns 434 may be exposed by the second air gap 514.

The second passivation pattern 510 may have a first opening part 522, a second opening part 524, and a third opening part 526, which respectively expose the upper surfaces of the first to third conductive patterns 210, 220, and 230 thereon. Each of the first to third opening parts 522, 524, and 526 may expose at least a part of the upper surface of each of the first to third conductive patterns 210, 220, and 230.

Fourth conductive patterns 240 may be respectively provided on the first to third conductive patterns 210, 220, and 230. Each fourth conductive pattern 240 may include a seed metal pattern 242. The seed metal patterns 242 may cover the upper surfaces of the first to third conductive patterns 210, 220, and 230, respectively. The seed metal patterns 242 may be seeds for electroplating processes. For example, the seed metal patterns 242 may include Ti, Au, or Ag. Each of the fourth conductive patterns 240 may include an electroplating pattern 244 on the seed metal pattern 242. In exemplary embodiments, the electroplating patterns 244 may include Au, Al, Cu, or Sn. The first and third conductive patterns 210 and 230 may be electrically connected to each other through a first conductive pad described later.

In general, when a passivation layer on a semiconductor structure contacts a conductive pattern, leakage current may flow between the semiconductor structure and the passivation layer. According to the concept of the inventive concept, as the first passivation pattern 310 on the semiconductor structure 10 is spaced from the first to third conductive patterns 210, 220, and 230, leakage current flowing between the semiconductor structure 10 and the first passivation pattern 310 may be minimized. Accordingly, a semiconductor device with improved electrical characteristics may be obtained.

Figure 4:
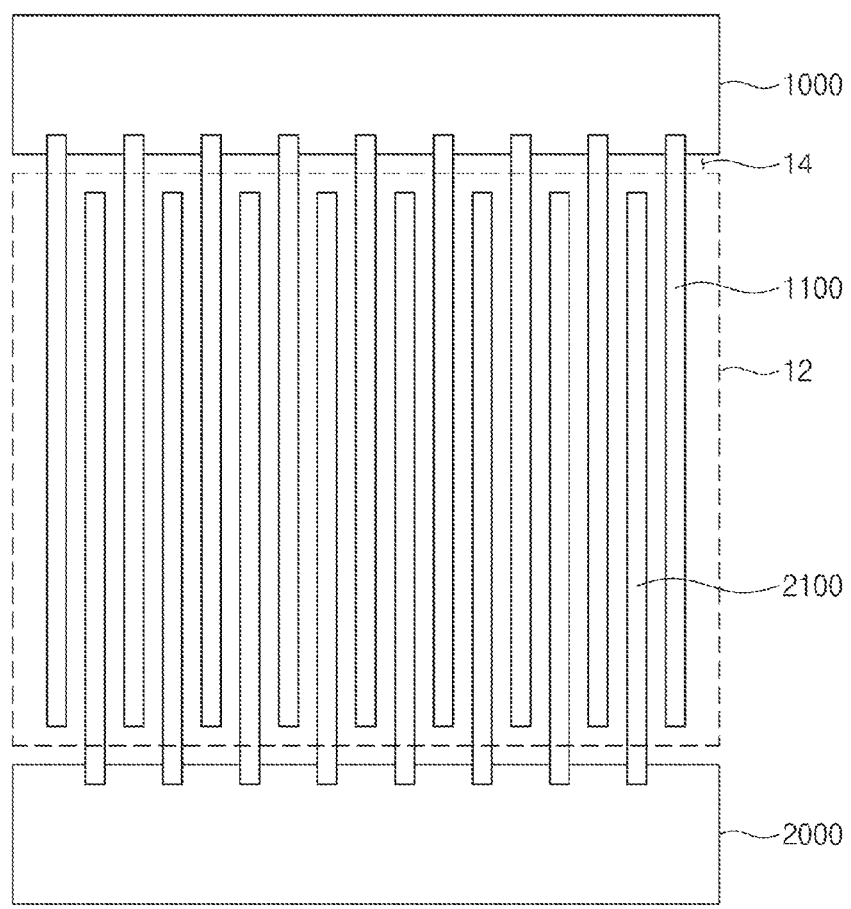
FIG. 4 is a plan view illustrating a semiconductor device according to exemplary embodiments of the technical spirit of the inventive concept.

FIG. 4 is a plan view illustrating a semiconductor device according to exemplary embodiments of the technical spirit of the inventive concept. For conciseness of description, contents substantially identical to the contents described with reference to FIGS. 1 to 3 are not described.

Referring to FIG. 4, an active region 12 and a device isolation area 14 may be provided. The active region 12 may include the substrate 100, the first and second semiconductor layers 110 and 120, the capping layer 130, the first and second conductive patterns 210 and 220, the first and second passivation patterns 310 and 510, and the first and second gap fill patterns 432 and 434, which are described with reference to FIGS. 1 to 3. Unlike FIGS. 1 to 3, a plurality of first conductive patterns 210 may be provided. The plurality of first conductive patterns 210 may be arranged in the first direction D1. In exemplary embodiments, one pair of first conductive patterns 210 adjacent to each other may be the first and third conductive patterns 210 and 230 described with reference to FIGS. 1 to 3. Unlike FIGS. 1 to 3, a plurality of second conductive patterns 220 may be provided. The plurality of second conductive patterns 210 may be arranged in the first direction D1 and may be positioned between each of the plurality of first conductive patterns 210. That is, the plurality of first conductive patterns 210 and the plurality of second conductive patterns 220 may be disposed alternately.

A first conductive pad 1000 and a second conductive pad 2000, which are spaced from the active region 12, may be provided. For example, the first conductive pad 1000 may be spaced from the active region 12 in the second direction D2, and the second conductive pad 2000 may be spaced from the active region 12 in the opposite direction of the second direction D2. The first and second conductive pads 1000 and 2000 may include a conductive material (for example, metal).

4a conductive patterns 1100 may be respectively provided on the plurality of first conductive patterns 210. The 4a conductive patterns 1100 may be substantially identical to the fourth conductive patterns 240 described with reference to FIGS. 1 to 3. The 4a conductive patterns 1100 may extend along the second direction D2. Each of the 4a conductive patterns 1100 may be electrically connected to the first conductive pattern 210 and the first conductive pad 1000. For example, one end part according to an extension direction of the 4a conductive patterns 1100 may directly contact the first conductive pattern 210, and another end part may directly contact the first conductive pad 1000.

4b conductive patterns 2100 may be respectively provided on the plurality of second conductive patterns 220. The 4b conductive patterns 2100 may be substantially identical to the fourth conductive patterns 240 described with reference to FIGS. 1 to 3. The 4b conductive patterns 2100 may extend along the second direction D2. Each of the 4b conductive patterns 2100 may be electrically connected to the second conductive pattern 220 and the second conductive pad 2000. For example, one end part according to an extension direction of the 4b conductive patterns 2100 may directly contact the second conductive pattern 220, and another end part may directly contact the second conductive pad 2000.

FIGS. 5, 7, 9, and 12 are plan views illustrating a method of fabricating a semiconductor device according to exemplary embodiments of the technical spirit of the inventive concept. FIGS. 6, 8, 10, 13, and 15 are sectional views taken along lines I-I' of FIGS. 5, 7, 9, and 12. FIGS. 11, 14, and 16 are sectional views taken along lines II-II' of FIGS. 9 and 12. For conciseness of description, contents substantially identical to the contents described with reference to FIGS. 1 to 3 are not described.

Figure 5:
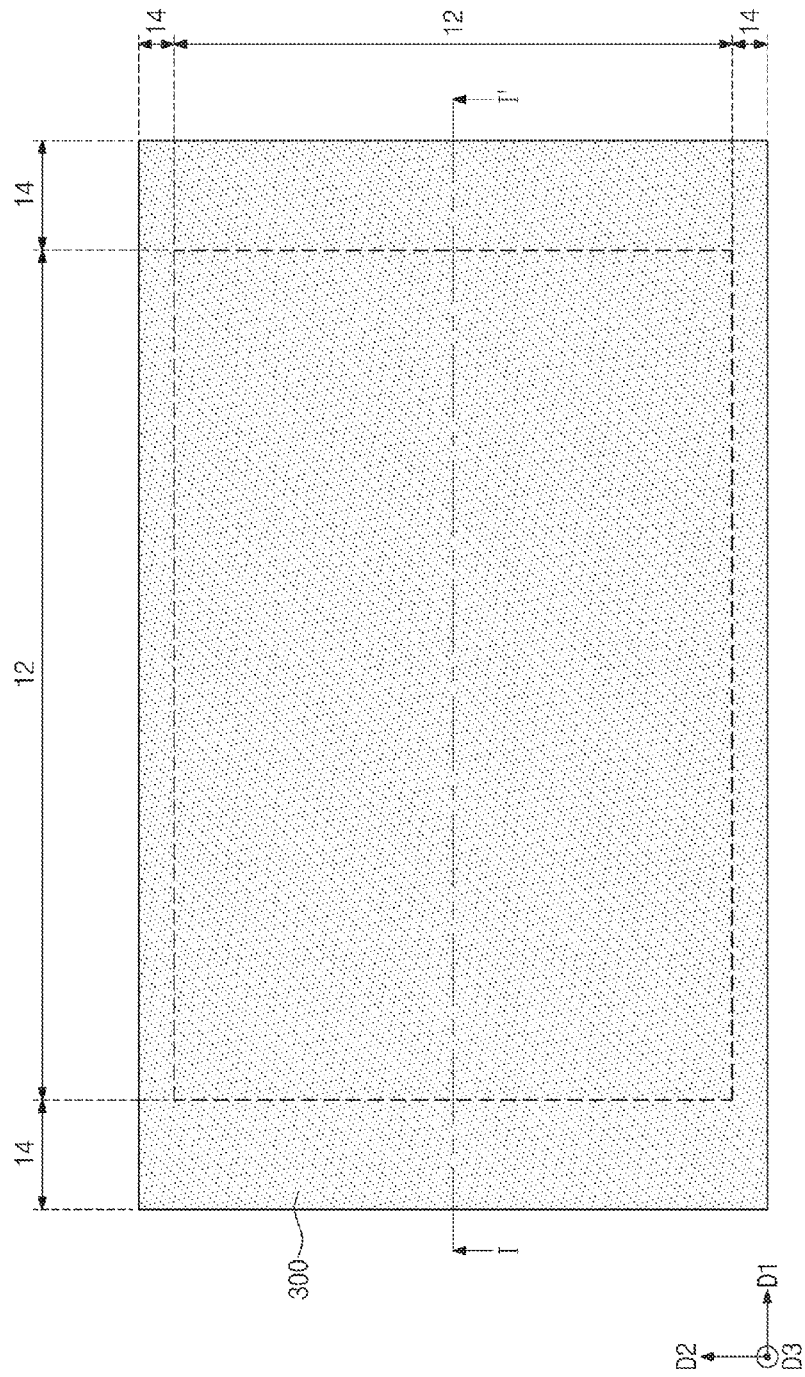
FIGS. 5, 7, 9, and 12 are plan views illustrating a method of fabricating a semiconductor device according to exemplary embodiments of the technical spirit of the inventive concept.
Figure 6:
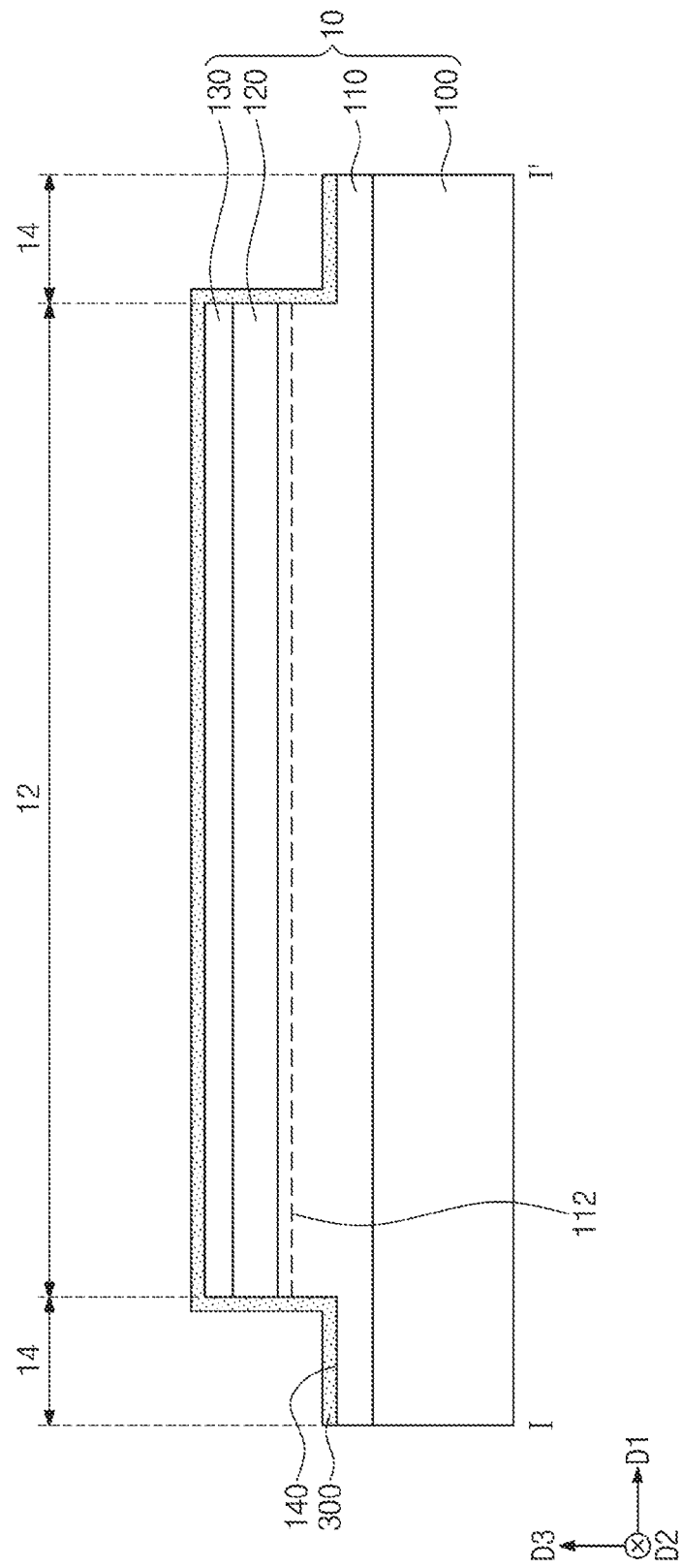
FIGS. 6, 8, 10, 13, and 15 are sectional views taken along lines I-I' of FIGS. 5, 7, 9, and 12.

Referring to FIGS. 5 to 6, a substrate 100 may be provided. The substrate 100 may be a high-resistance substrate having an insulating property. For example, the substrate 100 may include Al2O3, Si, GaAs, SiC, diamond, or GaN.

A first semiconductor layer 110, a second semiconductor layer 120, and a capping layer 130 may be provided on the substrate 100. The first semiconductor layer 110, the second semiconductor layer 120, and the capping layer 130 may be sequentially stacked. In exemplary embodiments, the first and second semiconductor layers 110 and 120 and the capping layer 130 may be formed by an epitaxial growth process. For example, the epitaxial growth process may include metal organic chemical vapor deposition, liquid phase epitaxy, hydride vapor phase epitaxy, Molecular beam epitaxy, or metal organic vapor phase epitaxy (MOVPE) The first and second semiconductor layers 110 and 120 may include a III-V compound semiconductor (for example, GaAs, GaN, AlN, InP, InGaAs, and AlGaN). For example, the first semiconductor layer 110 may include GaN and the second semiconductor layer 120 may include AlGaN. In exemplary embodiments, the capping layer 130 may include GaN. A semiconductor structure 10 may be defined with a structure including the substrate 100, the first and second semiconductor layers 110 and 120, and the capping layer 130.

As an end part of the semiconductor structure 10 is etched, a mesa-structure etching area 140 for defining an active region 12 may be formed. The mesa-structure etching area 140 may be a device isolation area 14. The active region 12 may protrude in a direction from a lower part of the semiconductor structure 10 toward an upper part of the semiconductor structure 10. For example, the active region 12 may protrude from a lower part of the semiconductor structure 10 along a direction vertical to an upper surface of the substrate 100. The forming of the mesa-structure etching area 140 may include etching an end part of the semiconductor structure 10 by performing dry etch or wet etch through an etching mask (not shown). In exemplary embodiments, a dry etching process may include Inductively Coupled Plasma Reactive Ion Etching (ICP RIE) using BCl3/Cl2 gas. An etching process for forming the mesa-structure etching region 140 may be performed from the capping layer 130 to the first semiconductor layer 110. Accordingly, at least a portion of the first semiconductor layer 110 may not be etched after an etching process for forming the mesa-structure etching region 140 and may remain on the substrate 100. Through an etching process for forming the mesa-structure etching region 140, sidewalls of the first and second semiconductor layers 110 and 120 and the capping layer 130 may be exposed. For example, through the mesa-structure etching region 140, a side of the second semiconductor layer 120, a side of the capping layer 130, and a side of an upper part and an upper surface of a lower part of the first semiconductor layer 110 may be exposed.

A first passivation layer 300 may be formed on the semiconductor structure 10. The first passivation layer 300 may conformally cover an upper part of the semiconductor structure 10. The first passivation layer 300 may extend into the mesa-structure etching region 140 on the capping layer 130. For example, the first passivation layer 300 may cover a side of the capping layer 130, a side of the second semiconductor layer 120, and a side and a lower surface of the first semiconductor layer 110, which are exposed by the mesa-structure etching area 140. In exemplary embodiments, a process for fabricating the first passivation layer 300 may include Atomic Layer Deposition (ALD), Molecular Beam Epitaxy (MBE), Plasma-Enhanced Chemical Vapor Deposition (PECVD), or thermal oxidation. The first passivation layer 300 may include SixNy, Al2O3, SiO2, or a combination thereof.

Figure 7:
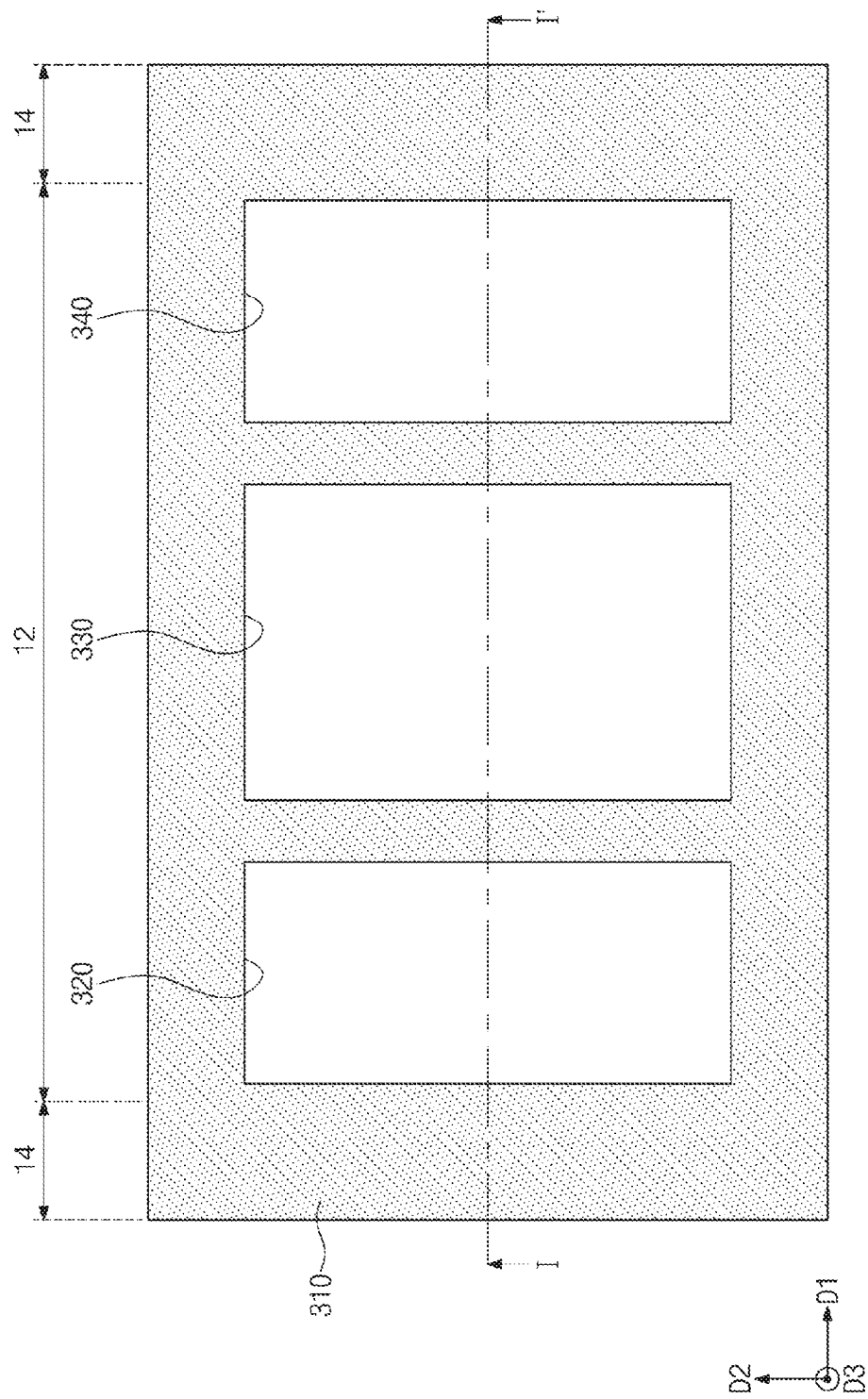
Figure 8:
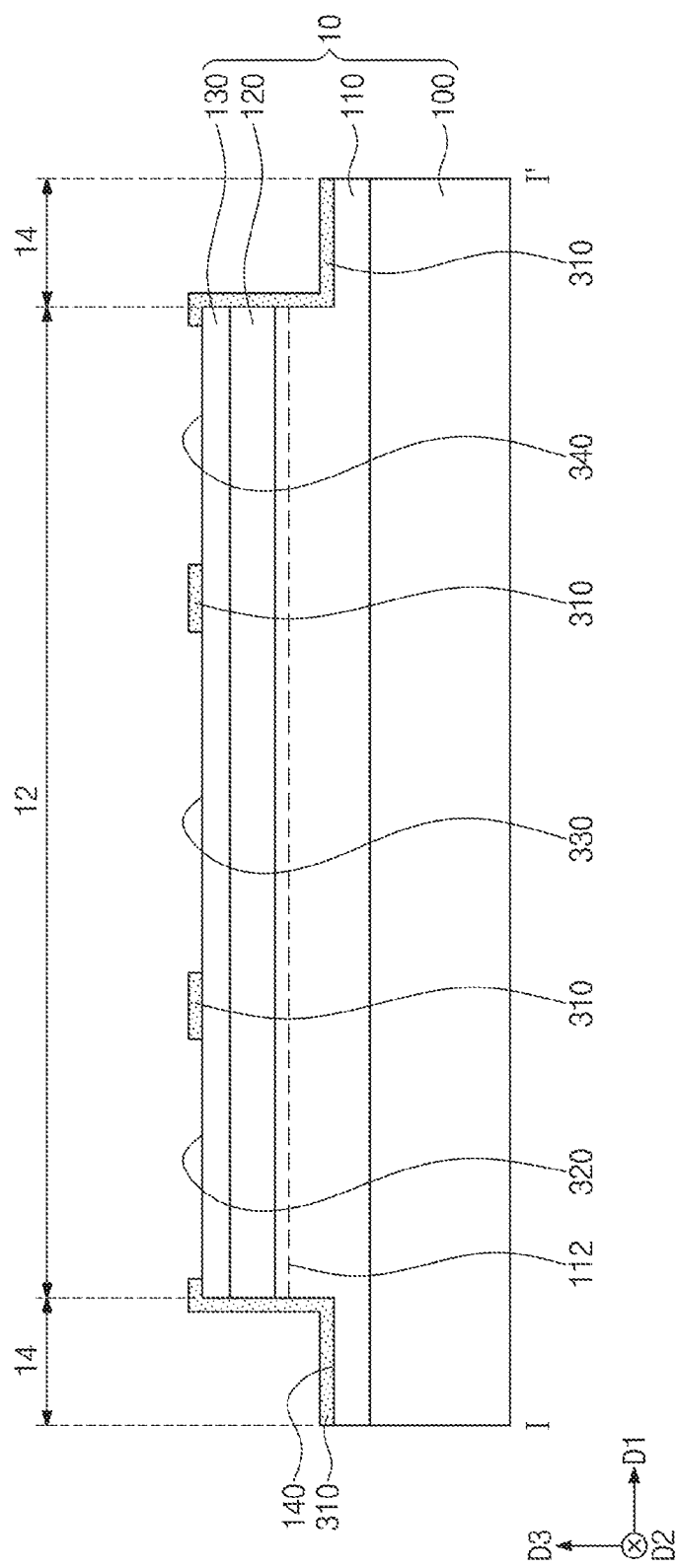

Referring to FIGS. 7 and 8, as the first passivation layer 300 described with reference to FIGS. 4 and 5 is patterned, a first passivation pattern 310 may be formed. A patterning process of the first passivation layer 300 may include a dry etching process or a dry etching process using an etching mask (not shown). For example, the first passivation pattern 310 may be formed through a Buffered Oxide Etch (BOE) process having an etching selectivity with respect to the first passivation layer 300.

The first passivation pattern 310 may include a first electrode hole 320, a second electrode hole 330, and a third electrode hole 340, which expose the capping layer 130. In exemplary embodiments, the first to third electrode holes 320, 330, and 340 may be holes penetrating the first passivation pattern 310 along a direction vertical to an upper surface of the substrate 100. Each of the first to third electrode holes 320, 330, and 340 may extend along the second direction D2. The first to third electrode holes 320, 330, and 340 may be arranged along the first direction D1 parallel to an upper surface of the substrate 100. For example, the first and third electrode holes 320 and 340 may be spaced along the first direction D1 and the second electrode hole 330 may be disposed between the first and third electrode holes 320 and 340. The second electrode hole 330 may be spaced the same distance from each of the first and third electrode holes 320 and 340. A separation distance according to the first direction D1 between the first and second electrode holes 320 and 330 may be a width according to the first direction D1 of the first passivation pattern 310 between the first and second electrode holes 320 and 330. In the same manner, a separation distance according to the first direction D1 between the second and third electrode holes 330 and 340 may be a width according to the first direction D1 of the first passivation pattern 310 between the second and third electrode holes 330 and 340. A width according to the first direction D1 of the first passivation pattern 310 between the first and second electrode holes 320 and 330 may be identical to a width according to the first direction D1 of the first passivation pattern 310 between the second and third electrode holes 330 and 340.

Each of the first to third electrode holes 320, 330, and 340 may have a width according to the first direction D1. A width according to the first direction D1 of each of the first to third electrode holes 320, 330, and 340 may be a separation distance according to the first direction D1 between sidewalls of the first passivation pattern 310 exposed by each of the first to third electrode holes 320, 330, and 340. In exemplary embodiments, a width according to the first direction D1 of the first electrode hole 320 and a width according to the first direction D1 of the third electrode hole 340 may be identical to each other. In exemplary embodiments, a width according to the first direction D1 of the second electrode hole 330 may be broader than a width according to the first direction D1 of each of the first and third electrode holes 320 and 340. Each of the first to third electrode holes 320, 330, and 340 may have a length that is parallel to an upper surface of the substrate 100 and extends along the second direction D2 intersecting the first direction D1. In exemplary embodiments, lengths according to the second direction D2 of the first to third electrode holes 320, 330, and 340 may be identical to each other.

Figure 9:
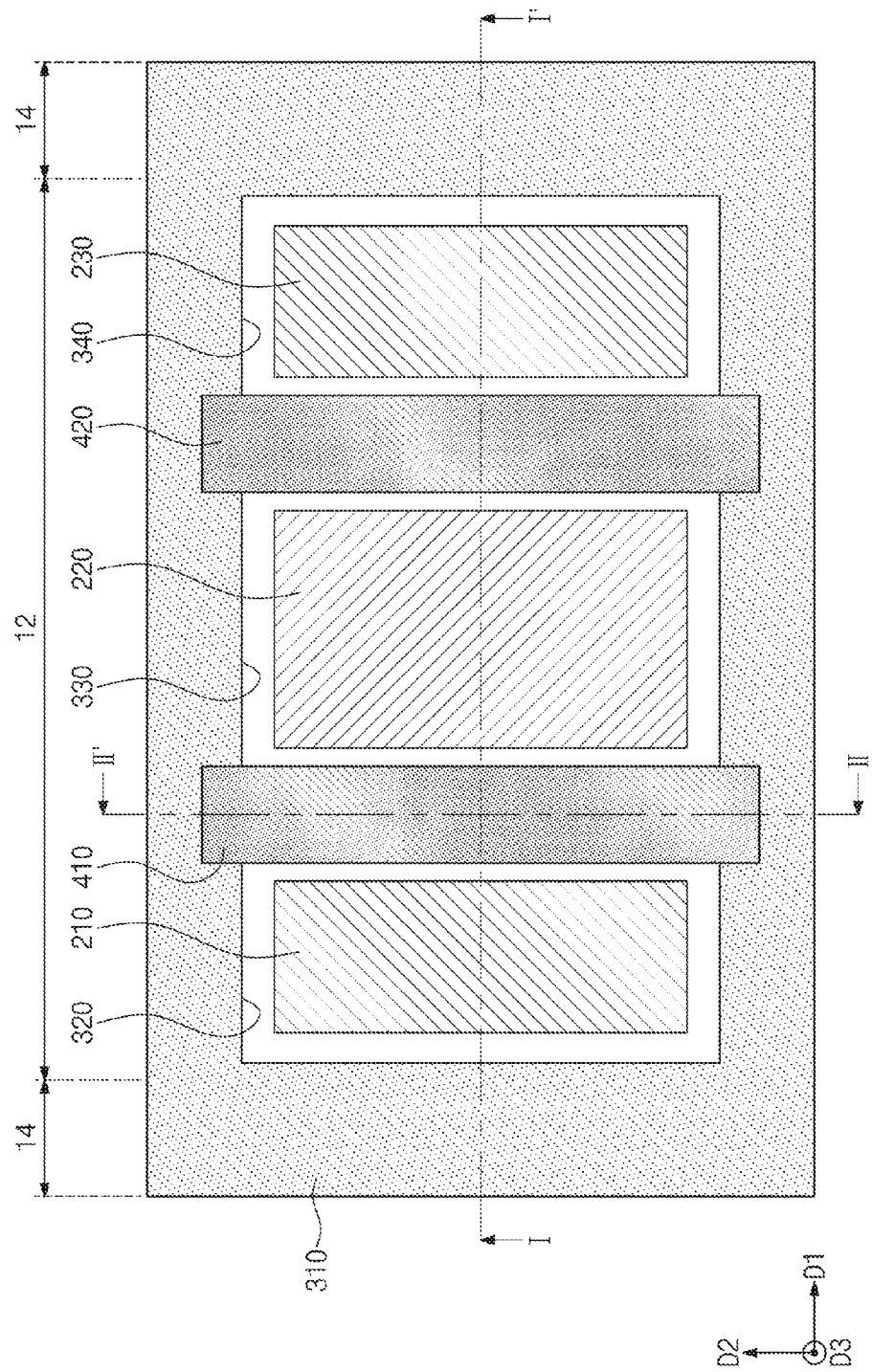
Figure 10:
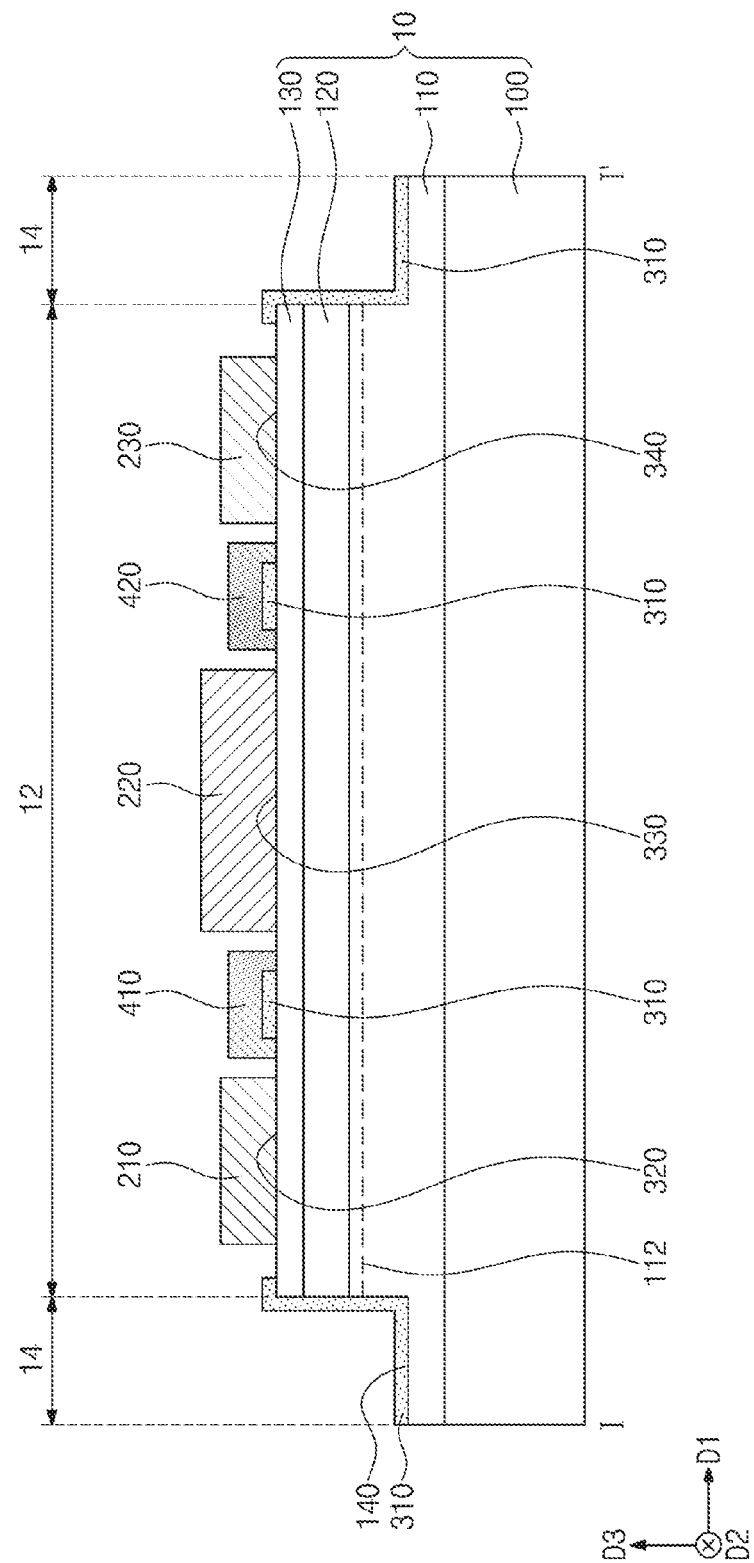
Figure 11:
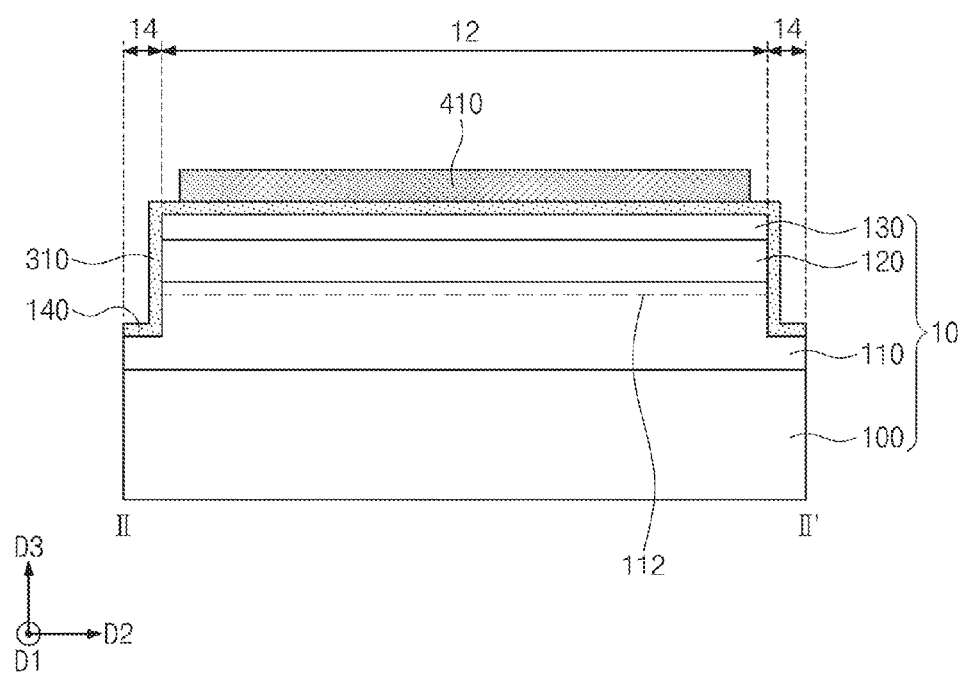
FIGS. 11, 14, and 16 are sectional views taken along lines II-II' of FIGS. 9 and 12.

Referring to FIGS. 9 to 11, the first conductive pattern 210, the second conductive pattern 220, and the third conductive pattern 230 may be respectively formed in the first to third electrode holes 320, 330, and 340. In exemplary embodiments, the formation process of the first to third conductive patterns 210, 220, and 230 may include an electron beam deposition method. Each of the first to third conductive patterns 210, 220, and 230 may be spaced from the first passivation pattern 310. The first and third conductive patterns 210 and 230 may include a metal that ohmic-contacts the capping layer 130. For example, the first and third conductive patterns 210 and 230 may include Ti, Al, Ni, Au, an alloy thereof, or a combination thereof. The second conductive pattern 220 may include a metal that is schottky-junctioned to the capping layer 130. For example, the second conductive pattern 220 may include Ni, Au, an alloy thereof, or a combination thereof. Although not shown in the drawing, the first conductive pattern 210 and the third conductive pattern 230 may be electrically connected to each other through the first conductive pad 1100 described with reference to FIG. 4.

A first sacrificial pattern 410 and a second sacrificial pattern 420 may be respectively formed between the first and second conductive patterns 210 and 220 and between the second and third conductive patterns 220 and 230. The first and second sacrificial patterns 410 and 420 may be formed through a process including forming a sacrificial layer (not shown) on the first to third conductive patterns 210, 220, and 230 and the first passivation pattern 310 and patterning the sacrificial layer. A formation process of the sacrificial layer may include a coating process (for example, spin coating). In exemplary embodiments, the sacrificial layer may include photoresist (PR) or poly(methyl methacrylate) (PMMA). A patterning process of the sacrificial layer may include a photolithography process of the sacrificial layer using a photo mask.

The first sacrificial pattern 410 may cover the first passivation pattern 310 disposed between the first and second conductive patterns 210 and 220. For example, the first sacrificial pattern 410 may cover an upper surface and sides of the first passivation pattern 310 disposed between the first and second conductive patterns 210 and 220. The first sacrificial pattern 410 may have a length that extends along the second direction D2. In exemplary embodiments, unlike the drawings, a length according to the second direction D2 of the first sacrificial pattern 410 may be identical to a length according to the second direction D2 of each of the first and second conductive patterns 210 and 220. For example, end parts of the first sacrificial pattern 410 according to the second direction D2 and end parts of each of the first and second conductive patterns 210 and 220 according to the second direction D2 may be aligned along the first direction D1. In exemplary embodiments, as shown in FIG. 8, a length according to the second direction D2 of the first sacrificial pattern 410 may be longer than a length according to the second direction D2 of each of the first and second conductive patterns 210 and 220. For example, end parts of the first sacrificial pattern 410 according to the second direction D2 may further protrude from the first sacrificial pattern 410 along the second direction D2 than end parts of each of the first and second conductive patterns 210 and 220 according to the second direction D2. The first sacrificial pattern 410 may be spaced from the first and second conductive patterns 210 and 220. For example, the first sacrificial pattern 410 may be spaced from the first and second conductive patterns 210 and 220 along the first direction D1. The first sacrificial pattern 410 and the first and second conductive patterns 210 and 220 may expose the capping layer 130. For example, an upper surface of the capping layer 130 between the first sacrificial pattern 410 and the first conductive pattern 210 and an upper surface of the capping layer 130 between the first sacrificial pattern 410 and the second conductive pattern 220 may be exposed. A thickness of the first sacrificial pattern 410 may be thinner than a thickness of each of the first and second conductive patterns 210 and 220. The highest height of an upper surface of the first sacrificial pattern 410 may be lower than the highest height of an upper surface of each of the first and second conductive patterns 210 and 220.

The second sacrificial pattern 420 may cover the first passivation pattern 310 disposed between the second and third conductive patterns 220 and 230. For example, the second sacrificial pattern 420 may cover an upper surface and sides of the first passivation pattern 310 disposed between the second and third conductive patterns 220 and 230. The second sacrificial pattern 420 may have a length that extends along the second direction D2. In exemplary embodiments, a length according to the second direction D2 of the second sacrificial pattern 420 may be identical to a length according to the second direction D2 of each of the second and third conductive patterns 220 and 230. For example, end parts of the second sacrificial pattern 420 according to the second direction D2 and end parts of each of the second and third conductive patterns 220 and 230 according to the second direction D2 may be aligned along the first direction D1. In exemplary embodiments, a length according to the second direction D2 of the second sacrificial pattern 420 may be longer than a length according to the second direction D2 of each of the second and third conductive patterns 220 and 230. For example, end parts of the second sacrificial pattern 420 according to the second direction D2 may further protrude from the second sacrificial pattern 420 along the second direction D2 than end parts of each of the second and third conductive patterns 220 and 230 according to the second direction D2. The second sacrificial pattern 420 may be spaced from the second and third conductive patterns 220 and 230. For example, the second sacrificial pattern 420 may be spaced from the second and third conductive patterns 220 and 230 along the first direction D1. The second sacrificial pattern 420 and the second and third conductive patterns 220 and 230 may expose the capping layer 130. For example, an upper surface of the capping layer 130 between the second sacrificial pattern 420 and the second conductive pattern 220 and an upper surface of the capping layer 130 between the second sacrificial pattern 420 and the third conductive pattern 230 may be exposed. A thickness of the second sacrificial pattern 420 may be thinner than a thickness of each of the second and third conductive patterns 220 and 230. The highest height of an upper surface of the second sacrificial pattern 420 may be lower than the highest height of an upper surface of each of the second and third conductive patterns 220 and 230.

Figure 12:
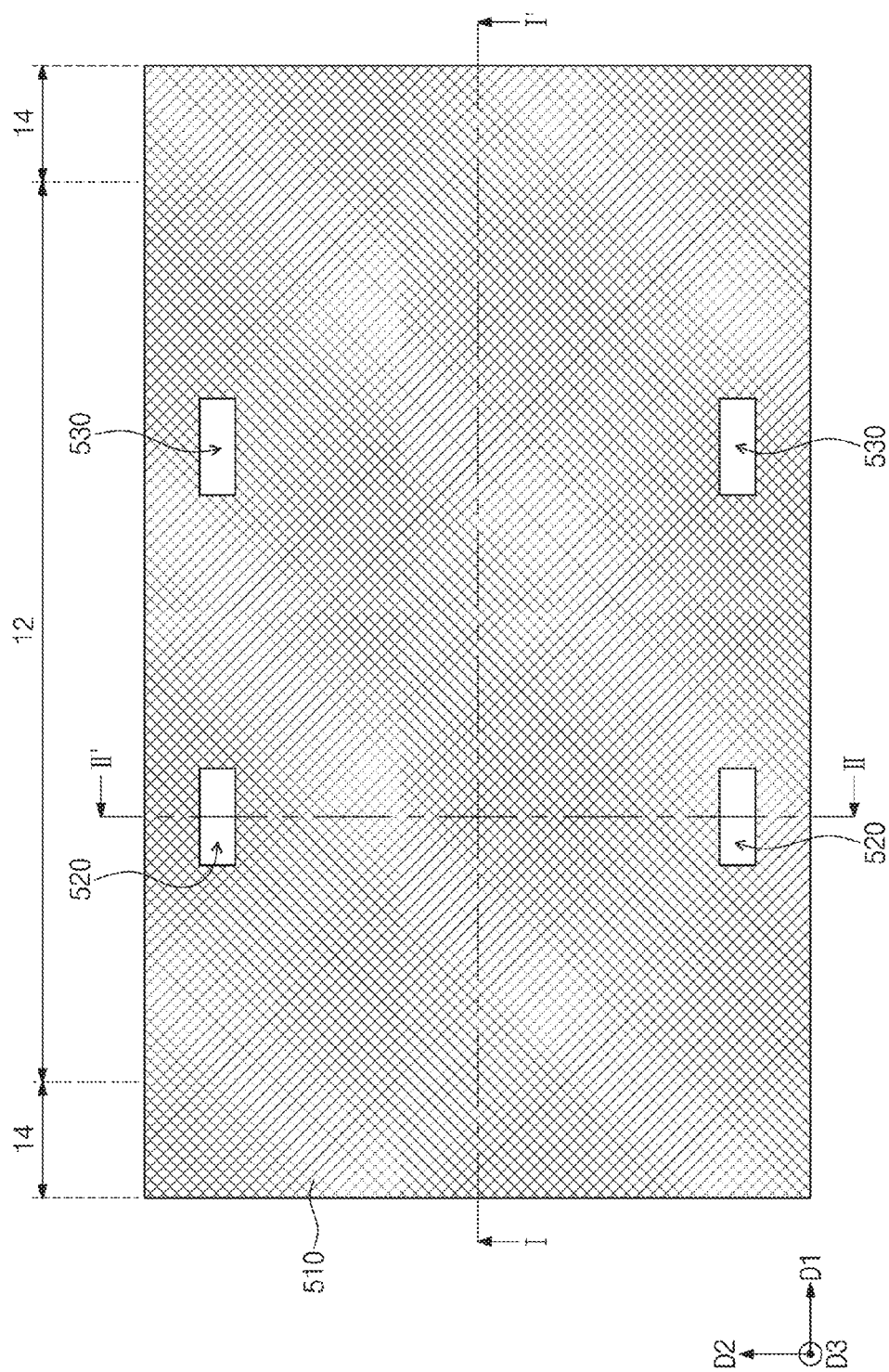
Figure 13:
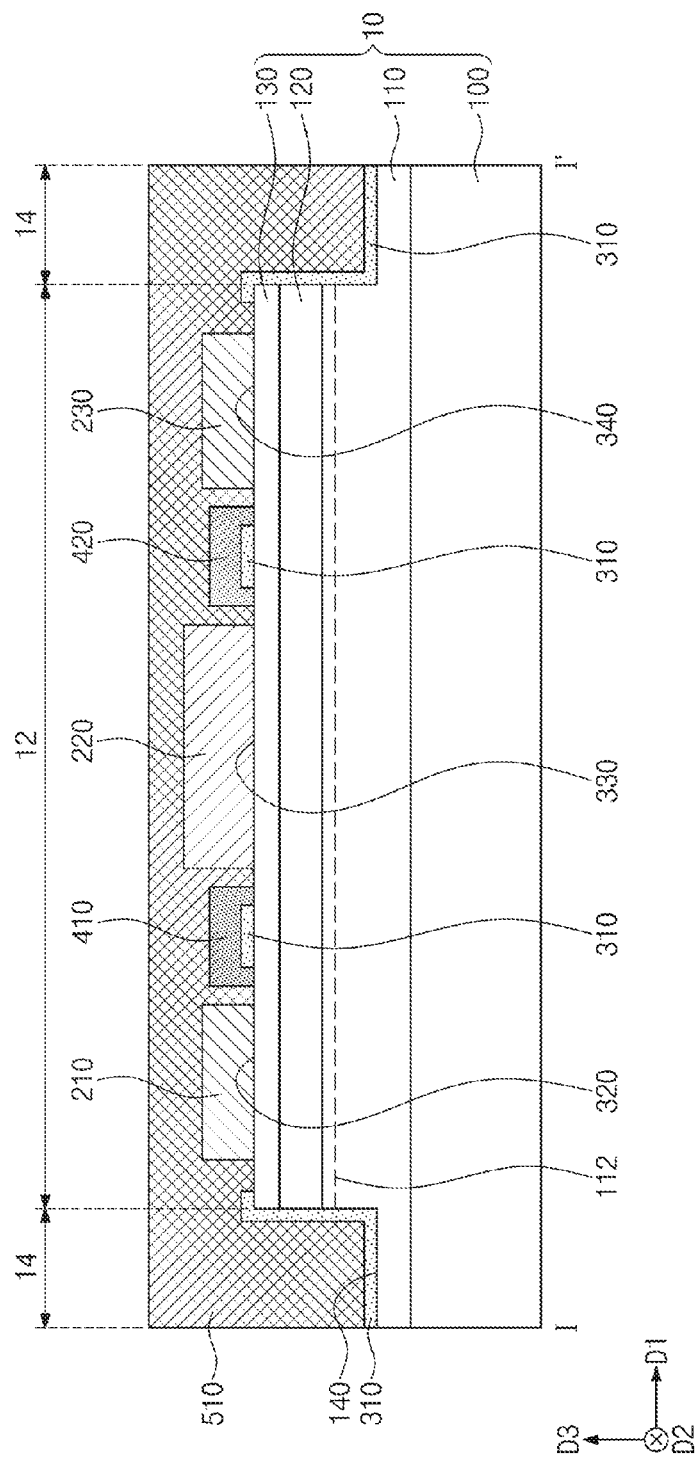
Figure 14:
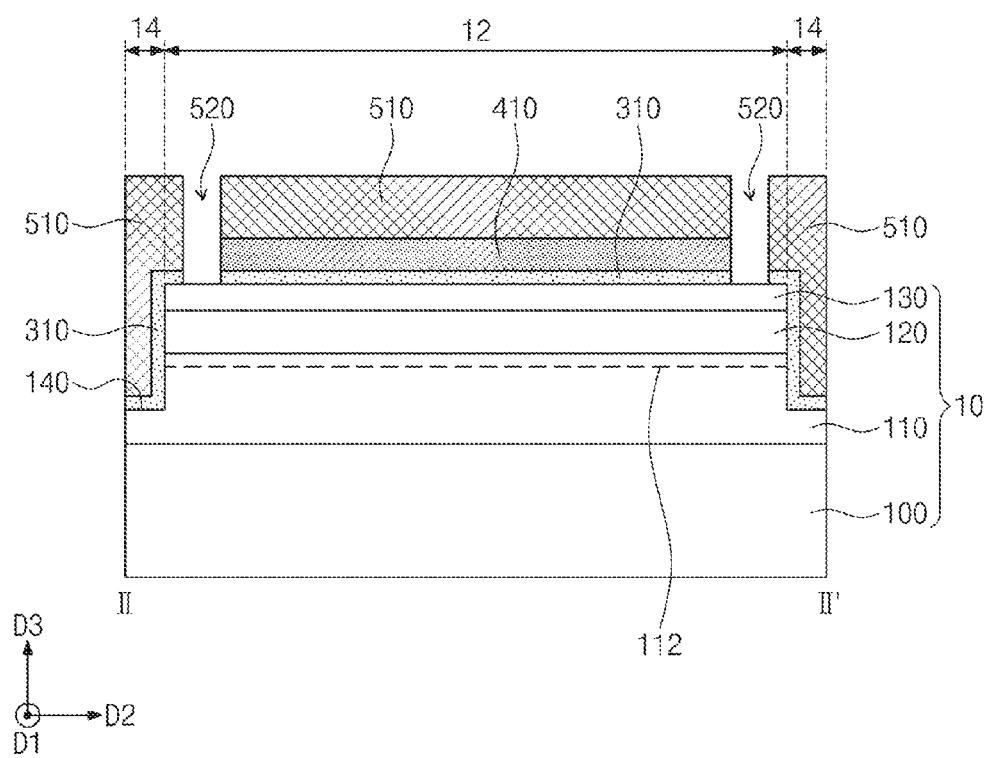

Referring to FIGS. 12 to 14, the second passivation pattern 510 having holes that expose the first and second sacrificial patterns 410 and 420 may be formed on the semiconductor structure 10, the first to third conductive patterns 210, 220, and 230, and the first passivation pattern 310. A formation process of the second passivation pattern 510 may include a process for forming a second passivation layer 500 and a process for forming a first hole 520 and a second hole 530 in the second passivation layer 500.

The second passivation layer 500 may cover the semiconductor structure 10, the first passivation pattern 310, the first to third conductive patterns 210, 220, and 230, and the first and second sacrificial patterns 410 and 420. In exemplary embodiments, a process for fabricating the second passivation layer 500 may include Atomic Layer Deposition (ALD), Molecular Beam Epitaxy (MBE), Plasma-Enhanced Chemical Vapor Deposition (PECVD), Sputtering Deposition, or thermal oxidation.

A process for forming the first hole 520 may include a process for performing dry etch or wet etch on the second passivation layer 500, the first sacrificial pattern 410, and the first passivation pattern 310 by using an etching mask. In exemplary embodiments, the second passivation layer 500, the first sacrificial pattern 410, and the first passivation pattern 310 may be dry-etched in a direction vertical to an upper surface of the substrate 100, so that they may form the first hole 520. A process for forming the first hole 520 may be performed until the capping layer 130 is exposed. The first hole 520 may expose an end part according to the second direction D2 of the first sacrificial pattern 410. In exemplary embodiments, one pair of first holes 520 may be provided. One pair of first holes 520 may expose one pair of end parts according to the second direction D2 of the first sacrificial pattern 410.

A process for forming the second hole 530 may include a process for performing dry etch or wet etch on the second passivation layer 500, the second sacrificial pattern 420, and the first passivation pattern 310 by using an etching mask. In exemplary embodiments, the second passivation layer 500, the second sacrificial pattern 420, and the first passivation pattern 310 may be dry-etched in a direction vertical to an upper surface of the substrate 100, so that they may form the second hole 530. A process for forming the second hole 530 may be performed until the capping layer 130 is exposed. The second hole 530 may expose an end part according to the second direction D2 of the second sacrificial pattern 420. In exemplary embodiments, one pair of second holes 530 may be provided. One pair of second holes 530 may expose one pair of end parts according to the second direction D2 of the second sacrificial pattern 420.

Figure 15:
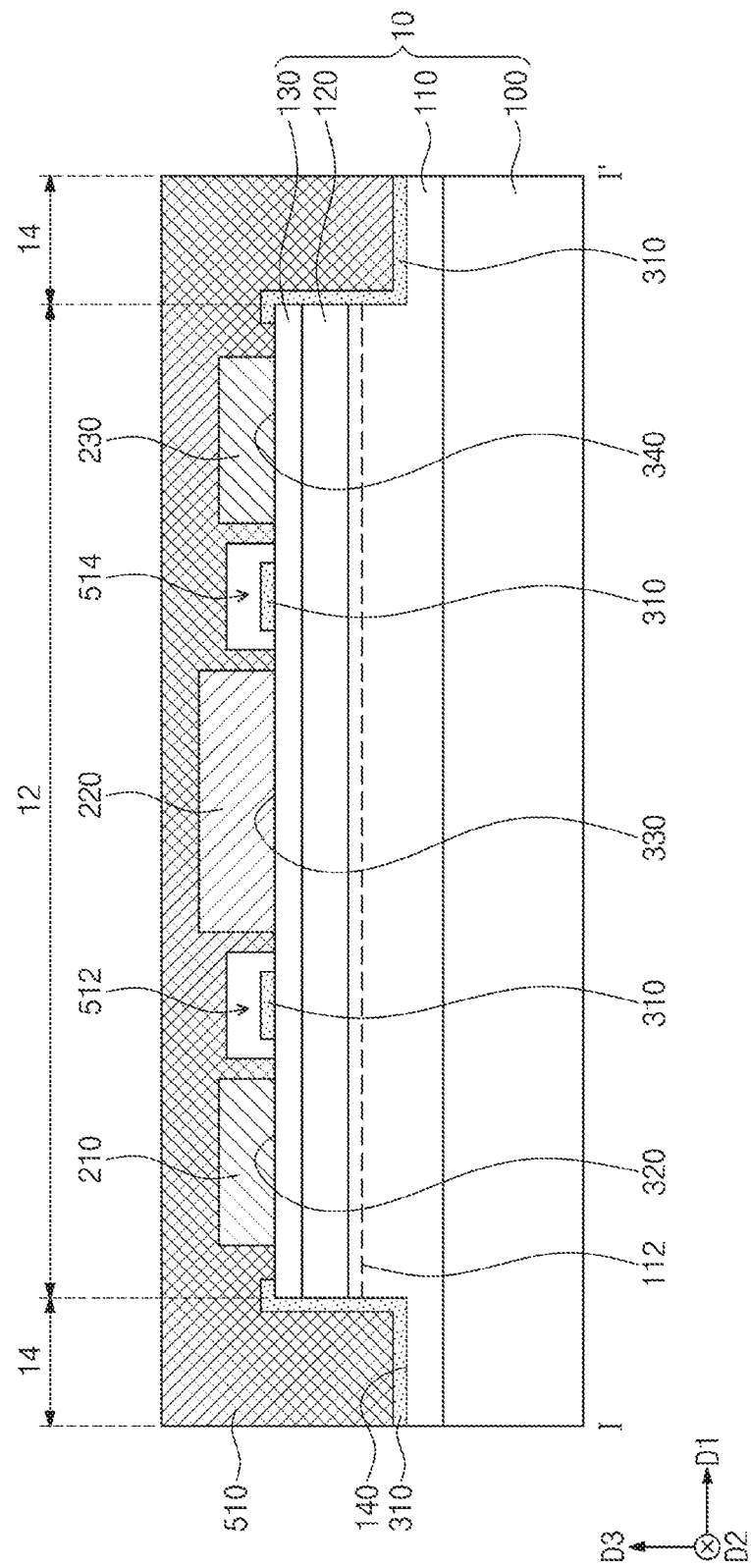
Figure 16:
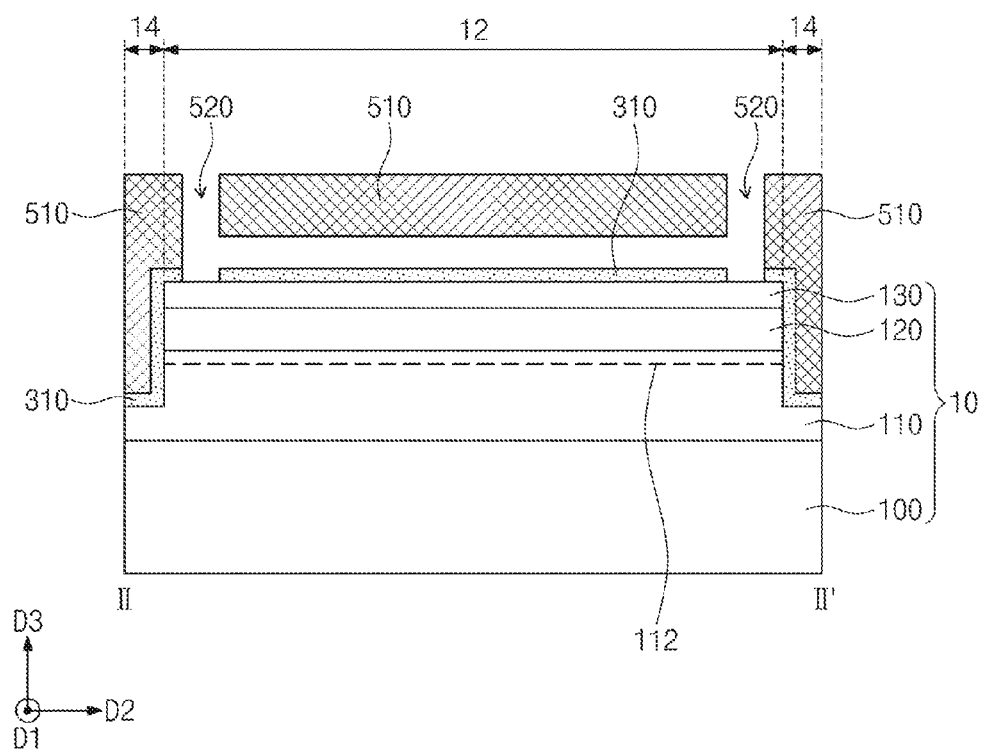

Referring to FIGS. 15 and 16, the first and second sacrificial patterns 410 and 420 are removed so that a first air gap 512 and a second air gap 514 may be formed between the first passivation pattern 310, the capping layer 130, and the second passivation pattern 510. A process for removing the first and second sacrificial patterns 410 and 420 may include a process for wet-etching the first and second sacrificial pattern 410 and 420. In exemplary embodiments, an etching liquid is injected through the first and second holes 520 and 530, so that it may etch the first and second sacrificial patterns 410 and 420. The etching liquid may include a material for etching a photoresist (for example, Acetone, EKC800™ by DuPont, or EKC830™ by DuPont) or a material for etching PMMA (for example, Butanol, or Trichloroethylene (TCE)).

The first passivation pattern 310 and the second passivation pattern 510, which are exposed through a removal process of the first sacrificial pattern 410, may be spaced from each other. For example, an upper surface of the first passivation pattern 310 and a lower surface of the second passivation pattern 510 may be spaced from each other along the third direction D3 vertical to an upper surface of the substrate 100. For example, sides of the first passivation pattern 310 may be spaced from sidewalls of a lower part of the second passivation pattern 510 facing each other along the first direction D1.

In the same manner, the first passivation pattern 310 and the second passivation pattern 510, which are exposed through a removal process of the second sacrificial pattern 420, may be spaced from each other. For example, an upper surface of the first passivation pattern 310 and a lower surface of the second passivation pattern 510 may be spaced from each other along the third direction D3. For example, sides of the first passivation pattern 310 may be spaced from sidewalls of a lower part of the second passivation pattern 510 facing each other along the first direction D1.

Referring to FIGS. 1 to 3 again, a semiconductor device may be formed by filling the insides of the first and second holes 520 and 530, which are described with reference to FIGS. 15 and 16, with the first gap fill pattern 432 and the second gap fill pattern 434. The first and second gap fill patterns 432 and 434 may define the first air gap 512 and the second air gap 514, respectively. The first air gap 512 may include the first passivation pattern 310 therein. The first air gap 512 may expose the capping layer 130, the first passivation pattern 310, the second passivation pattern 510, and the first gap fill pattern 432. The second air gap 514 may expose the capping layer 130, the first passivation pattern 310, the second passivation pattern 510, and the second gap fill pattern 434.

In exemplary embodiments, a process for forming the first and second gap fill patterns 432 and 434 may include a process for providing a liquid gap fill material (not shown) to the inside of each of the first and second holes 520 and 530. The liquid gap fill material may be cured in the first and second holes 520 and 530. The first and second gap fill patterns 432 and 434 may include an insulating material or a dielectric material. Materials of the first and second gap fill patterns 432 and 434 may be different from those of the first and second passivation patterns 310 and 510. For example, the first and second gap fill patterns 432 and 434 may include Benzocyclobutene (BCB) or polyimide. Each of the first and second gap fill patterns 432 and 434 may fill the first and second holes 520 and 530 from a lower part to an upper part of each of the first and second holes 520 and 530. In exemplary embodiments, a portion of the liquid gap fill material flows into the first and second air gaps 512 and 514 so that the first and second gap fill patterns 432 and 434 may be formed in the first and second air gaps 512 and 514, respectively.

A fourth conductive pattern 240 may be formed on each of the first to third conductive patterns 210, 220, and 230. The fourth conductive patterns 240 may increase the density of current and lower the on-resistance of a semiconductor device through the first to third conductive patterns 210, 220, and 230. A process for forming the fourth conductive patterns 240 may include a process for patterning the second passivation pattern 510 and an electroplating process of the fourth conductive pattern 240. The process for patterning the second passivation layer 500 may be performed by dry-etching or wet-etching the second passivation pattern 510 by using an etching mask. The second passivation pattern 510 may expose an upper surface of each of the first to third conductive patterns 210, 220, and 230. The electroplating process of the fourth conductive patterns 240 may include a process for forming seed metal patterns 242 on the first to third conductive patterns 210, 220, and 230, respectively, and a process for forming the electroplating patterns 244 on the seed metal patterns 242, respectively, by using an electroplating method. After the forming of a seed metal layer (not shown) that covers the second passivation pattern 510 and the first to third conductive patterns 210, 220, and 230, the seed metal patterns 242 may be formed by pattering the seed metal layer. In exemplary embodiments, the seed metal patterns 242 may include Ti, Au, or Ag, and the electroplating patterns 244 may include Au or Al.

In general, when a passivation layer on a semiconductor structure contacts a conductive pattern, leakage current may flow between the semiconductor structure and the passivation layer. When the leakage current is minimized, the characteristics of a semiconductor device may be improved. According to the concept of the inventive concept, as the first passivation pattern 310 on the semiconductor structure 10 is spaced from the first to third conductive patterns 210, 220, and 230, leakage current flowing between the semiconductor structure 10 and the first passivation pattern 310 may be minimized. Accordingly, a semiconductor device with improved performance may be obtained.

Figure 17:
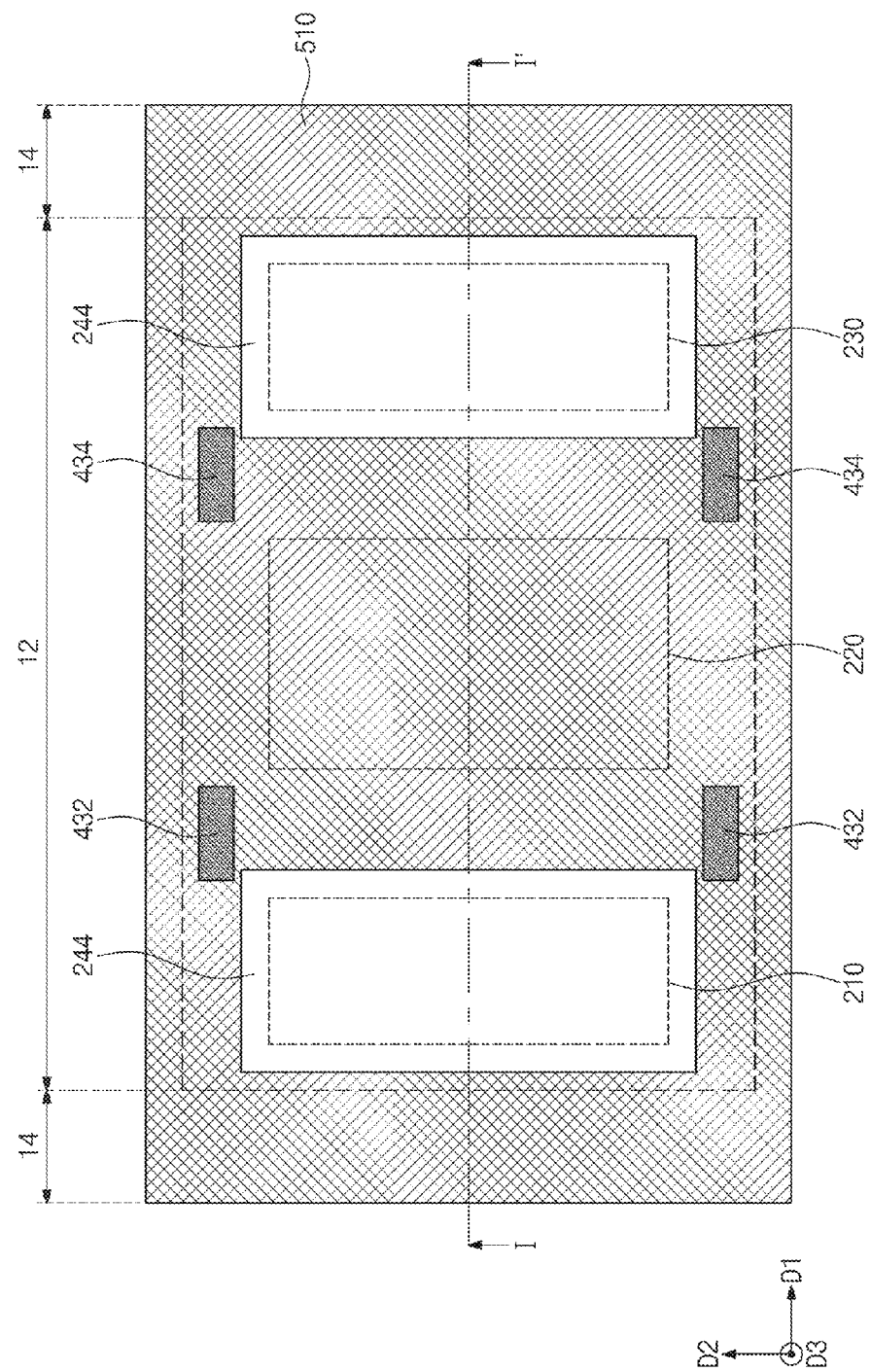
FIG. 17 is a plan view illustrating a semiconductor device according to exemplary embodiments of the technical spirit of the inventive concept.
Figure 18:
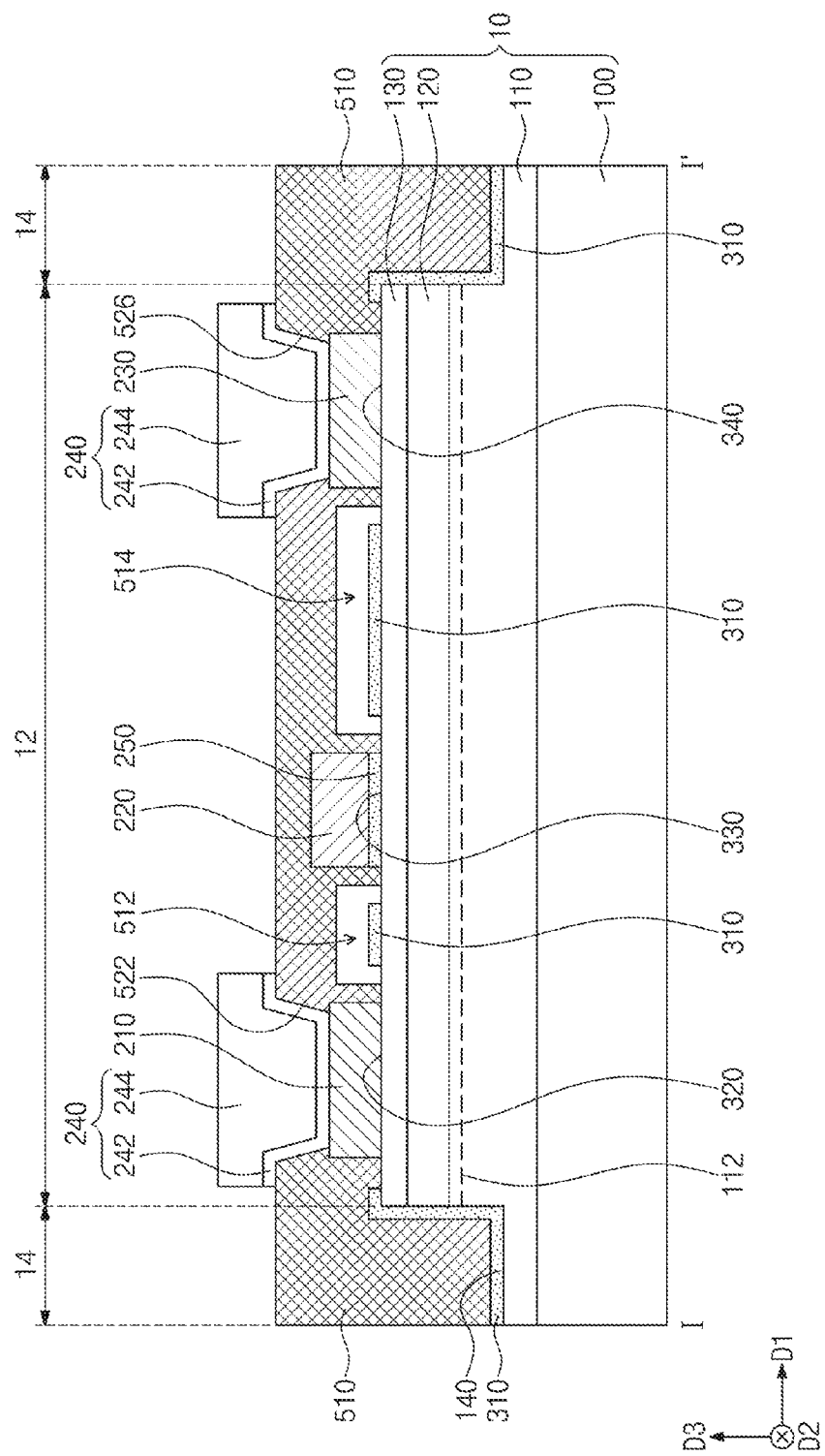
FIG. 18 is a sectional view taken along a line I-I' of FIG. 17.

FIG. 17 is a plan view illustrating a semiconductor device according to exemplary embodiments of the technical spirit of the inventive concept. FIG. 18 is a sectional view taken along a line I-I' of FIG. 17. For conciseness of description, contents substantially identical to the contents described with reference to FIGS. 1 to 3 are not described.

Referring to FIGS. 17 and 18, a semiconductor structure 10 including a substrate 100, a first semiconductor layer 110, a second semiconductor layer 120, and a capping layer 130 may be provided. A first conductive pattern 210, a second conductive pattern 220, and a third conductive pattern 230, which are arranged along the first direction D1 parallel to an upper surface of the substrate 100, may be provided on the semiconductor structure 10. In exemplary embodiments, the first to third conductive patterns 210, 220, and 230 may be a source electrode, a gate electrode, and a drain electrode, respectively. A gate insulating pattern 250 may be interposed between the second conductive pattern 220 and the semiconductor structure 10. The gate insulating pattern 250 may include an insulating material or a dielectric material.

The first passivation pattern 310 may be provided between the first and second conductive patterns 210 and 220 and between the second and third conductive patterns 220 and 230. The first passivation pattern 310 may be spaced from each of the first to third conductive patterns 210, 220, and 230. Each of the first passivation patterns 310 between the first and second conductive patterns 210 and 220 and between the second and third conductive patterns 220 and 230 may have a width according to the first direction D1. In exemplary embodiments, a width according to the first direction D1 of the first passivation pattern 310 between the first and second conductive patterns 210 and 220 may be smaller than a width according to the first direction D1 of the first passivation pattern 310 between the second and third conductive patterns 220 and 230.

The second passivation pattern 510 having a first air gap 512 and a second air gap 514 therebelow may be provided on the first passivation pattern 310. Each of the first and second air gaps 512 and 514 may have a width according to the first direction D1. A width according to the first direction D1 of each of the first and second air gaps 512 and 514 may be a separation distance according to the first direction D1 between sidewalls facing each other of the second passivation pattern 510 exposed by each of the first and second air gaps 512 and 514. In exemplary embodiments, a width according to the first direction D1 between the first air gaps 512 may be smaller than a width according to the first direction D1 between the second air gaps 514.

Fourth conductive patterns 240 may be provided on the first and third conductive patterns 210 and 230. In exemplary embodiments, each of the fourth conductive patterns 240 may include a seed metal pattern 242 and an electroplating pattern 244, which are stacked sequentially. Although not shown in the drawing, the fourth conductive pattern 240 may be provided on the second conductive pattern 220. The fourth conductive pattern 240 on the second conductive pattern 220 may be parallel to an upper surface of the substrate 100 and may be spaced from the fourth conductive patterns 240 on the first and third conductive patterns 210 and 230 along the second direction D2 intersecting the first direction D1.

According to the concept of the inventive concept, as the first passivation pattern 310 on the semiconductor structure 10 is spaced from the first to third conductive patterns 210, 220, and 230, leakage current flowing between the semiconductor structure 10 and the first passivation pattern 310 may be minimized. Accordingly, a semiconductor device with improved performance may be obtained.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:
1. A semiconductor device comprising:
a semiconductor structure comprising a substrate, a first semiconductor layer on the substrate, and a second semiconductor layer on the first semiconductor layer;
a first conductive pattern on the semiconductor structure;
a second conductive pattern spaced apart from the first conductive pattern in a first direction parallel to a top surface of the substrate;
a first passivation pattern provided between the first and second conductive patterns; and a second passivation pattern provided on the first passivation pattern, wherein the first conductive pattern, the first passivation pattern, and the second conductive pattern are arranged in the first direction, wherein the first passivation pattern is directly in contact with a top surface of the semiconductor structure, and wherein each of the first and second conductive patterns is spaced apart from the first passivation pattern in the first direction, and the first and second passivation patterns are spaced apart from each other.

2. The semiconductor device of claim 1,
wherein a first air gap is provided between the first and second passivation patterns, and
wherein the first and second passivation patterns are spaced apart from each other by the first air gap.

3. The semiconductor device of claim 2, wherein the first and second passivation patterns are exposed by the first air gap and the first and second passivation patterns exposed by the first air gap are spaced from each other.

4. The semiconductor device of claim 2, wherein the second passivation pattern covers a side of the first conductive pattern and a side of the second conductive pattern, which face each other.

5. The semiconductor device of claim 2, wherein the second passivation pattern covers an upper surface of the semiconductor structure immediately adjacent to each of a side of the first conductive pattern and a side of the second conductive pattern, which face each other.

6. The semiconductor device of claim 2, wherein at least a part of an upper surface of the semiconductor structure between the first and second conductive patterns is exposed by the first air gap.

7. The semiconductor device of claim 2, further comprising a gap fill pattern penetrating the second passivation pattern to contact the semiconductor structure.

8. The semiconductor device of claim 7, wherein a lower part of the gap fill pattern is exposed by the first air gap.

9. The semiconductor device of claim 7, wherein a lower part of the gap fill pattern contacts an end part of the first passivation pattern between the first and second conductive patterns.

10. The semiconductor device of claim 7, wherein the gap fill pattern is spaced from an area between the first and second conductive patterns along an extension direction of the first and second conductive patterns.

11. The semiconductor device of claim 2, further comprising a third conductive pattern spaced from the first conductive pattern with the second conductive pattern therebetween, wherein the third conductive pattern is spaced from the first passivation pattern;

the second passivation pattern is spaced from the first passivation pattern between the second and third conductive patterns and a second air gap is provided between the first passivation pattern and the second passivation pattern, between the second and third conductive patterns; and the first and third conductive patterns are electrically connected to each other.

12. The semiconductor device of claim 2, further comprising:

a gate insulating pattern interposed between the second conductive pattern and the semiconductor structure; and a third conductive pattern disposed on an opposite side of the first conductive pattern on the basis of the second conductive pattern, wherein the third conductive pattern is spaced from the first passivation pattern; and the second passivation pattern is spaced from the first passivation pattern between the second and third conductive patterns and a second air gap is provided between the first passivation pattern and the second passivation pattern, between the second and third conductive patterns.

13. The semiconductor device of claim 1, wherein the first conductive pattern comprises a metal that ohmic-contacts the semiconductor structure; and the second conductive pattern comprises a metal that is schottky-junctioned to the semiconductor structure.

14. The semiconductor device of claim 1, wherein the first semiconductor layer comprises a 2-dimensional (2-DEG) electron gas layer in an area adjacent to a boundary of the first and second semiconductor layers.

15. The semiconductor device of claim 14, wherein the first semiconductor layer comprises a GaN layer and the second semiconductor layer comprises an AlGaN layer.

16. The semiconductor device of claim 1, wherein the semiconductor structure further comprises a capping layer on the second semiconductor layer.

* * * * *